(12) United States Patent
Tofigh et al.

(10) Patent No.: US 7,747,879 B2
(45) Date of Patent: Jun. 29, 2010

(54) POWER DISTRIBUTION SYSTEM USING SOLID STATE POWER CONTROLLERS

(75) Inventors: Farshid Tofigh, Mission Viejo, CA (US); Otmar Kruppa, Deiningen (DE); Imtiaz Khan, Trabuco Canyon, CA (US); Iraj Ghahramani, Mission Viejo, CA (US); David Lawton, Santa Ana, CA (US); Kent Policky, Tustin Ranch, CA (US)

(73) Assignee: Leach International Corporation, Buena Park, CA (US)

( * ) Notice: Subject to any disclaimer, the term of this patent is extended or adjusted under 35 U.S.C. 154(b) by 519 days.

(21) Appl. No.: 11/356,487

(22) Filed: Feb. 16, 2006

(65) Prior Publication Data

US 2006/0200688 A1    Sep. 7, 2006

Related U.S. Application Data

(60) Provisional application No. 60/653,846, filed on Feb. 16, 2005.

(51) Int. Cl.
  G06F 1/00      (2006.01)
  H02H 3/00      (2006.01)
  H02H 7/00      (2006.01)
(52) U.S. Cl. ............................ 713/300; 396/116; 361/5; 361/7; 361/42; 361/44
(58) Field of Classification Search .................. 713/300; 398/116; 361/5, 7, 42, 44
  See application file for complete search history.

(56) References Cited

U.S. PATENT DOCUMENTS

| | | | |
|---|---|---|---|
| 3,958,131 A | 5/1976 | Mozdzer | |
| 4,009,420 A | 2/1977 | Martinez-dePison | |
| 4,106,013 A | 8/1978 | Cronin | |
| 4,110,809 A | 8/1978 | Cronin | |
| 4,156,837 A | 5/1979 | Baker | |
| 4,174,496 A | 11/1979 | McFall et al. | |
| 4,245,184 A | 1/1981 | Billings et al. | |
| 4,245,185 A | 1/1981 | Mitchell et al. | |

(Continued)

FOREIGN PATENT DOCUMENTS

EP    1298770 A2    4/2003

(Continued)

OTHER PUBLICATIONS

Zhenghon Qian, "Magnetoresistive signal isolators employing liner spin valve sensing resistors" May 15, 2003, Journal of Applied Physics, vol. 93, No. 10.*

(Continued)

Primary Examiner—Vincent T Tran
(74) Attorney, Agent, or Firm—Christie, Parker & Hale, LLP

(57) ABSTRACT

Solid state power controllers are described that include a switch controlled by a microcontroller and communication contacts. In one aspect of the invention, the microcontroller is galvanically isolated from the communication contacts using magnetoresistive isolation. In another aspect of the invention a number of solid state power controllers are connected to an external microcontroller to form a power distribution array. In addition, messages exchanged between the external microcontroller and the solid state power controllers can be used to configure the solid state power controllers and provide a user interface.

35 Claims, 31 Drawing Sheets

U.S. PATENT DOCUMENTS

| | | | |
|---|---|---|---|
| 4,319,145 A | 3/1982 | Apfelbeck | |
| 4,336,568 A | 6/1982 | Mitchell | |
| 4,346,375 A | 8/1982 | Billings | |
| 4,359,681 A | 11/1982 | Baker et al. | |
| 4,626,954 A | 12/1986 | Damiano et al. | |
| 4,704,652 A | 11/1987 | Billings | |
| 4,705,962 A | 11/1987 | Kinoshita et al. | |
| 4,740,883 A | 4/1988 | McCollum | |
| 4,864,214 A | 9/1989 | Billings et al. | |
| 4,879,625 A * | 11/1989 | Potenzone | 361/90 |
| 4,955,069 A | 9/1990 | Ionescu | |
| 5,087,865 A | 2/1992 | Nelson, III | |
| 5,155,289 A | 10/1992 | Bowles | |
| 5,444,590 A | 8/1995 | LeComte et al. | |
| 5,455,731 A | 10/1995 | Parkinson | |
| 5,497,072 A | 3/1996 | LeComte et al. | |
| 5,615,105 A * | 3/1997 | Tofigh et al. | 700/9 |
| 5,723,915 A | 3/1998 | Maher et al. | |
| 5,752,047 A | 5/1998 | Darty et al. | |
| 5,993,039 A * | 11/1999 | Crill | 700/79 |
| 6,121,693 A | 9/2000 | Rock | |
| 6,121,787 A * | 9/2000 | Jacobson et al. | 324/765 |
| 6,287,513 B1 | 9/2001 | Grady et al. | |
| 6,470,224 B1 | 10/2002 | Drake et al. | |
| 6,664,656 B2 | 12/2003 | Bernier | |
| 6,713,195 B2 | 3/2004 | Wang et al. | |
| 6,768,350 B1 | 7/2004 | Dickey | |
| 6,798,628 B1 | 9/2004 | Macbeth | |
| 6,856,045 B1 | 2/2005 | Beneditz et al. | |
| 6,943,558 B2 | 9/2005 | Hale et al. | |
| 6,973,491 B1 | 12/2005 | Staveley et al. | |
| 7,007,179 B2 | 2/2006 | Mares et al. | |
| 7,020,790 B2 | 3/2006 | Mares | |
| 7,177,125 B2 * | 2/2007 | Lazarovich et al. | 361/42 |
| 2002/0108065 A1 | 8/2002 | Mares | |
| 2002/0128759 A1 | 9/2002 | Sodoski et al. | |
| 2002/0135236 A1 | 9/2002 | Haigh et al. | |
| 2003/0047997 A1 | 3/2003 | Bernier | |
| 2003/0095367 A1 | 5/2003 | Mares et al. | |
| 2003/0193767 A1 | 10/2003 | Vicente et al. | |
| 2004/0156154 A1 | 8/2004 | Lazarovich et al. | |
| 2005/0017706 A1 * | 1/2005 | Balakrishnan et al. | 323/320 |
| 2005/0046367 A1 * | 3/2005 | Wevers et al. | 318/280 |
| 2005/0069321 A1 * | 3/2005 | Sullivan | 398/116 |
| 2005/0185353 A1 * | 8/2005 | Rasmussen et al. | 361/93.9 |
| 2006/0071559 A1 * | 4/2006 | Hanson et al. | 307/43 |

FOREIGN PATENT DOCUMENTS

FR     2818402 A1     6/2002

OTHER PUBLICATIONS

Khan et al., "Arc Fault Detector," source and date unknown, pp. 1-4.
Lavado et al., "Arc Fault Protection and Thermal Aircraft Circuit Breakers," last revision date: Sep. 17, 2001, source and date unknown), pp. 1-9.
International Search Report dated Jun. 11, 2007 and mailed Sep. 25, 2007, Corresponding to PCT/US06/05814, Leach International Corporation (3 pgs.).
PCT Written Opinion of the International Searching Authority, dated Jun. 11, 2007 and mailed Sep. 25, 2007, Corresponding to PCT/US06/05814, (7 pgs.).
European Search Report for EP Application No. 06748223; dated Oct. 29, 2008; 9 pages.
Derwent Abstract—FR2818402; 2 pages (listed above).
State Intellectual Property Office of P.R. China; The Notification of the First Office Action for Chinese Application No. 200680005073.3; dated Jun. 26, 2009; 15 pages (English Translation).

* cited by examiner

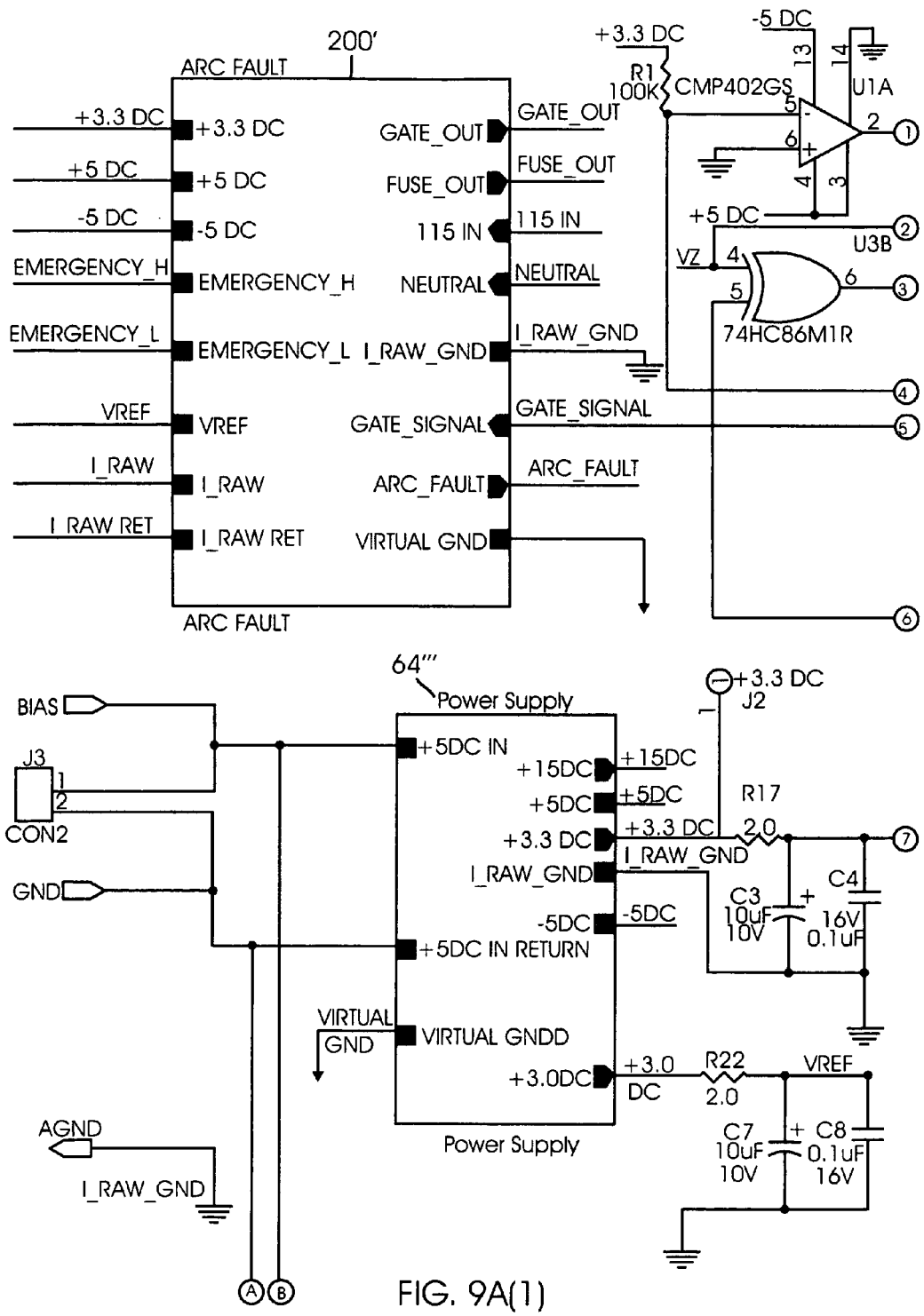
FIG. 9A(1)

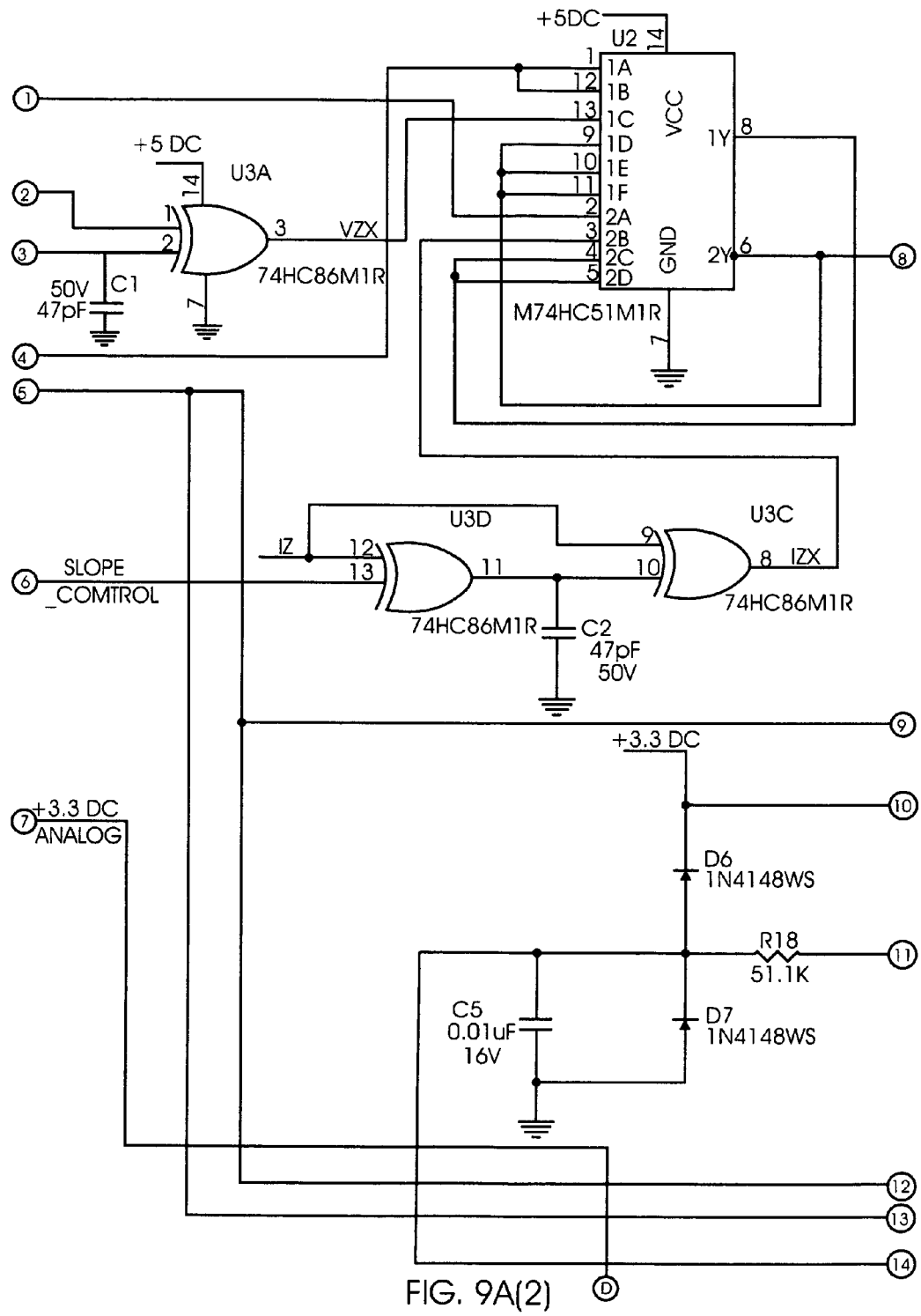
FIG. 9A(2)

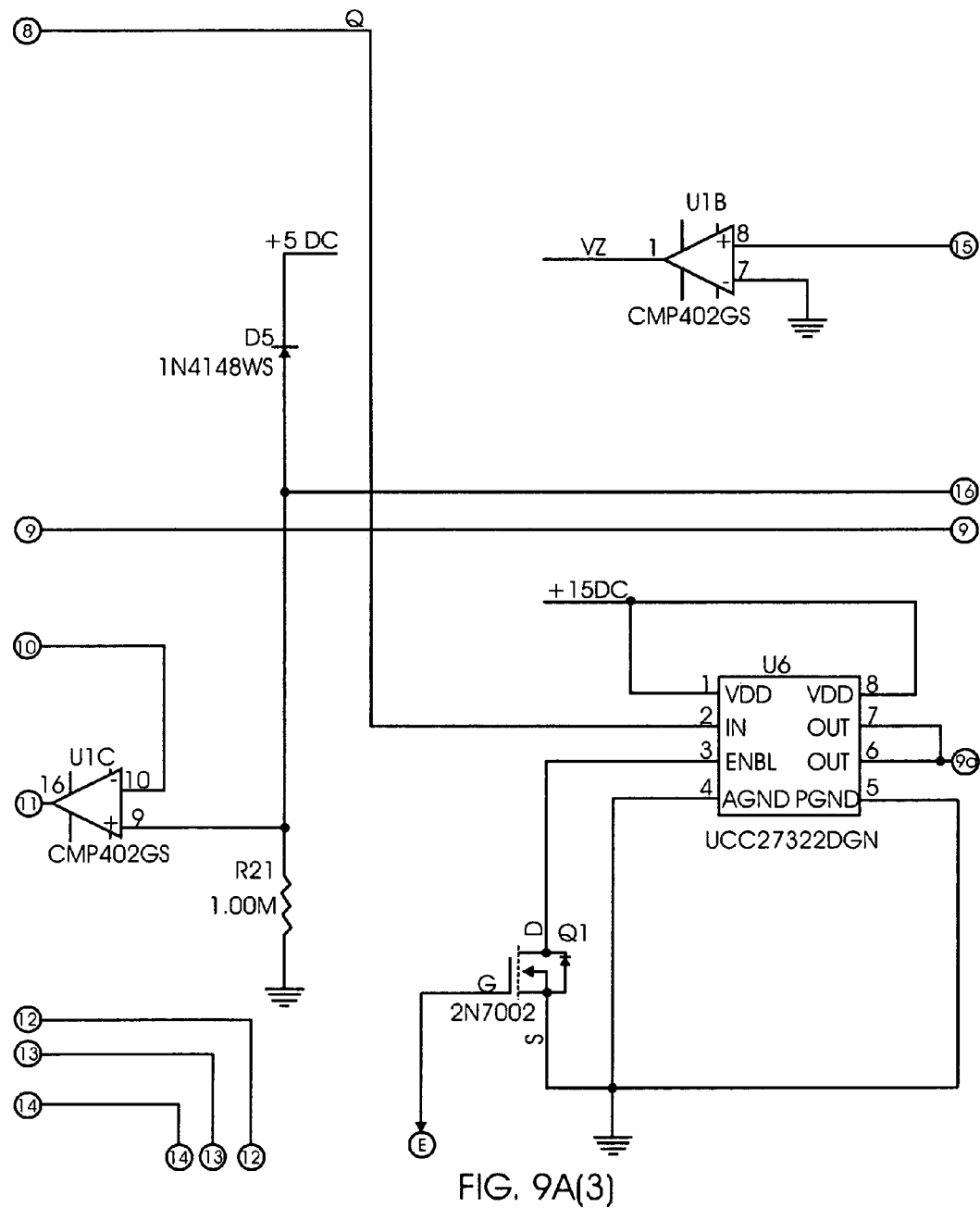
FIG. 9A(3)

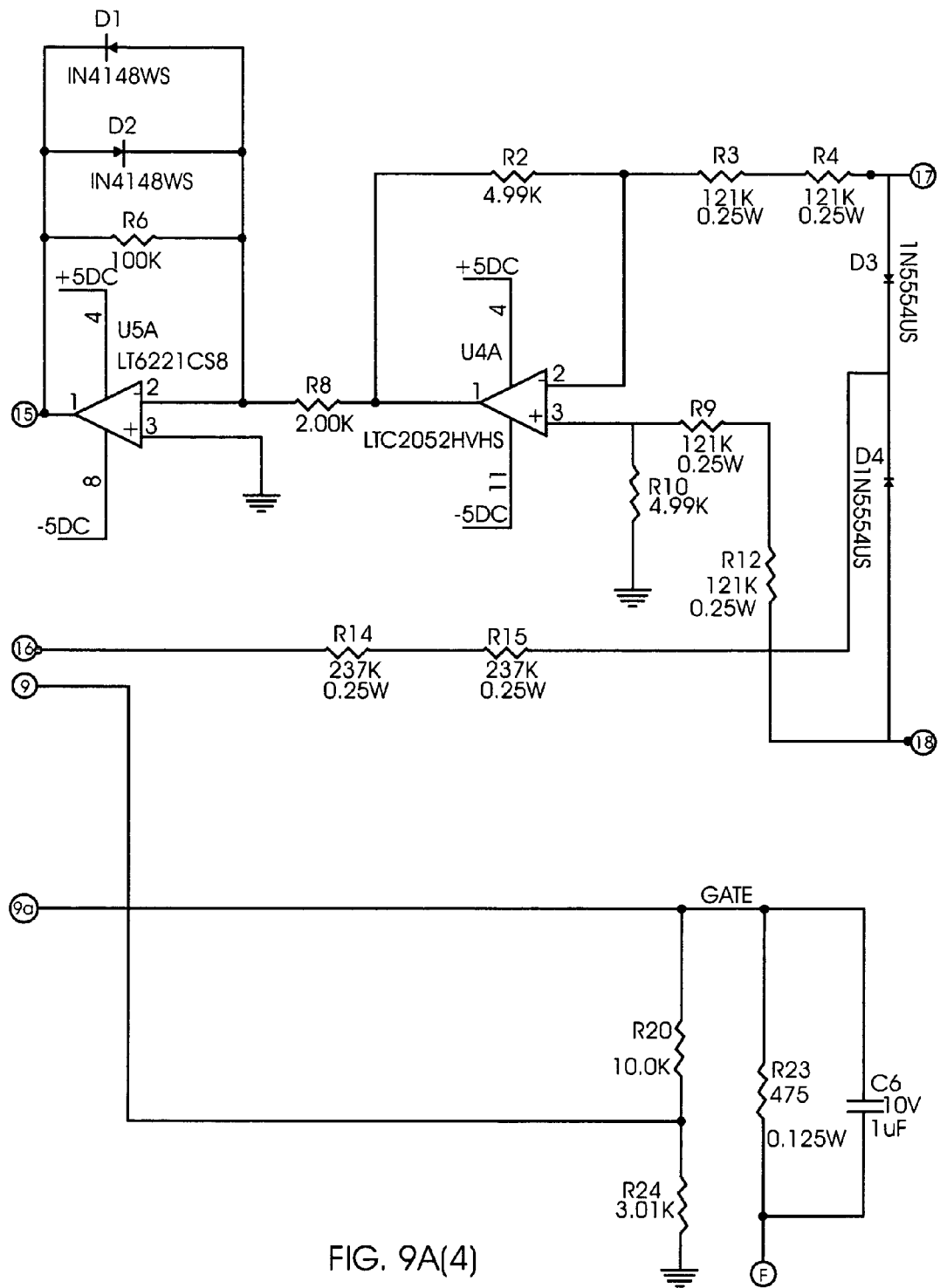
FIG. 9A(4)

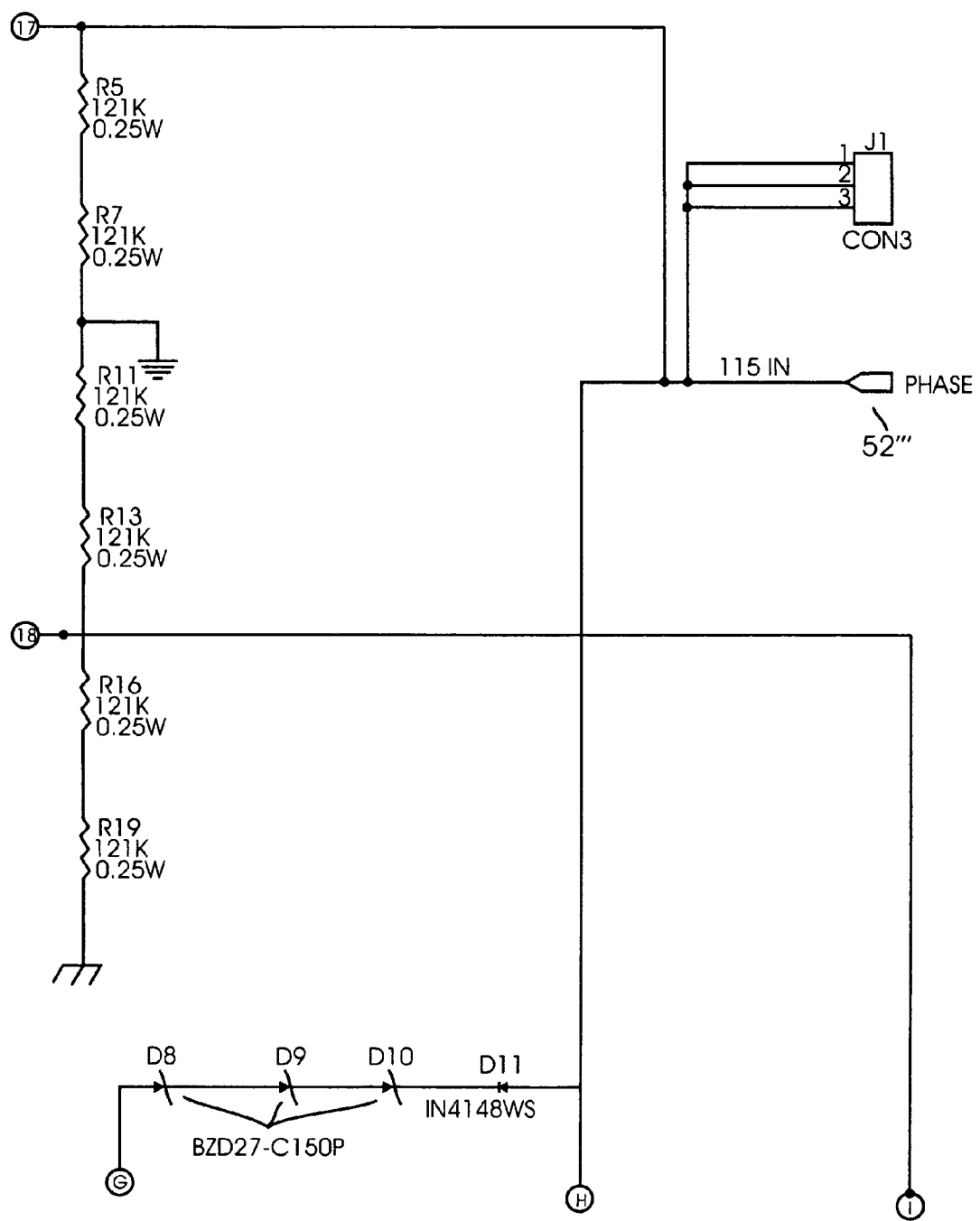
FIG. 9A(5)

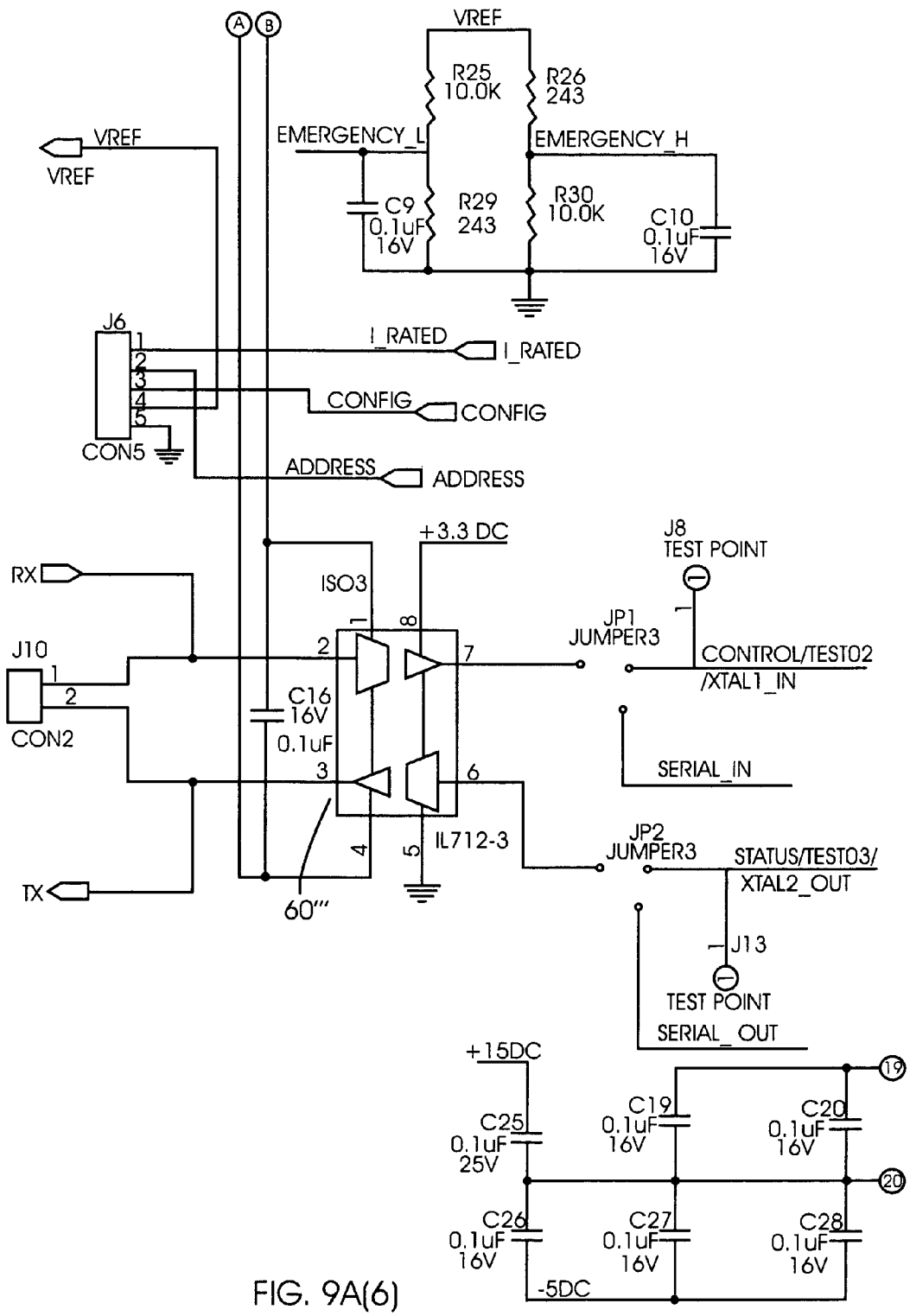
FIG. 9A(6)

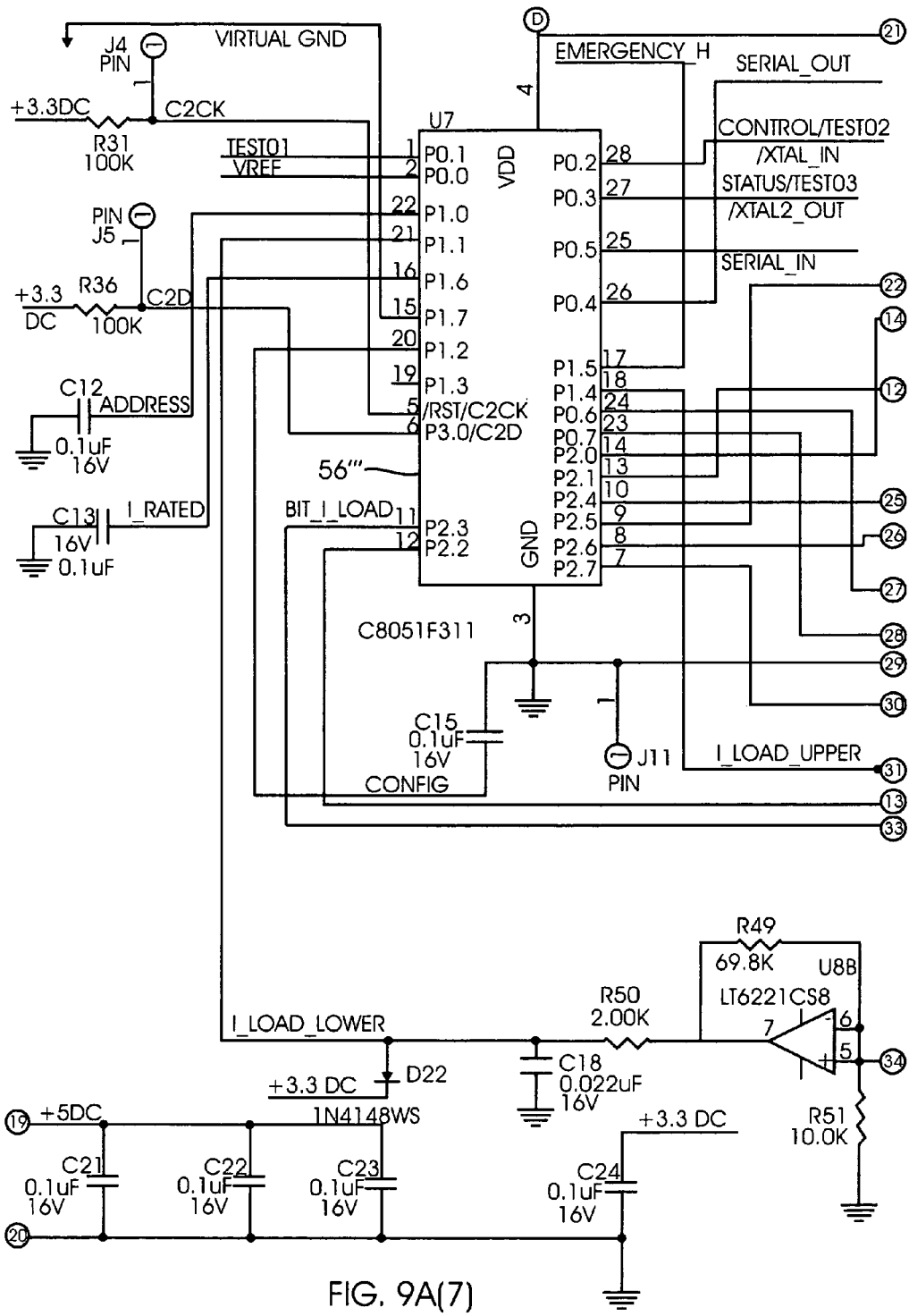
FIG. 9A(7)

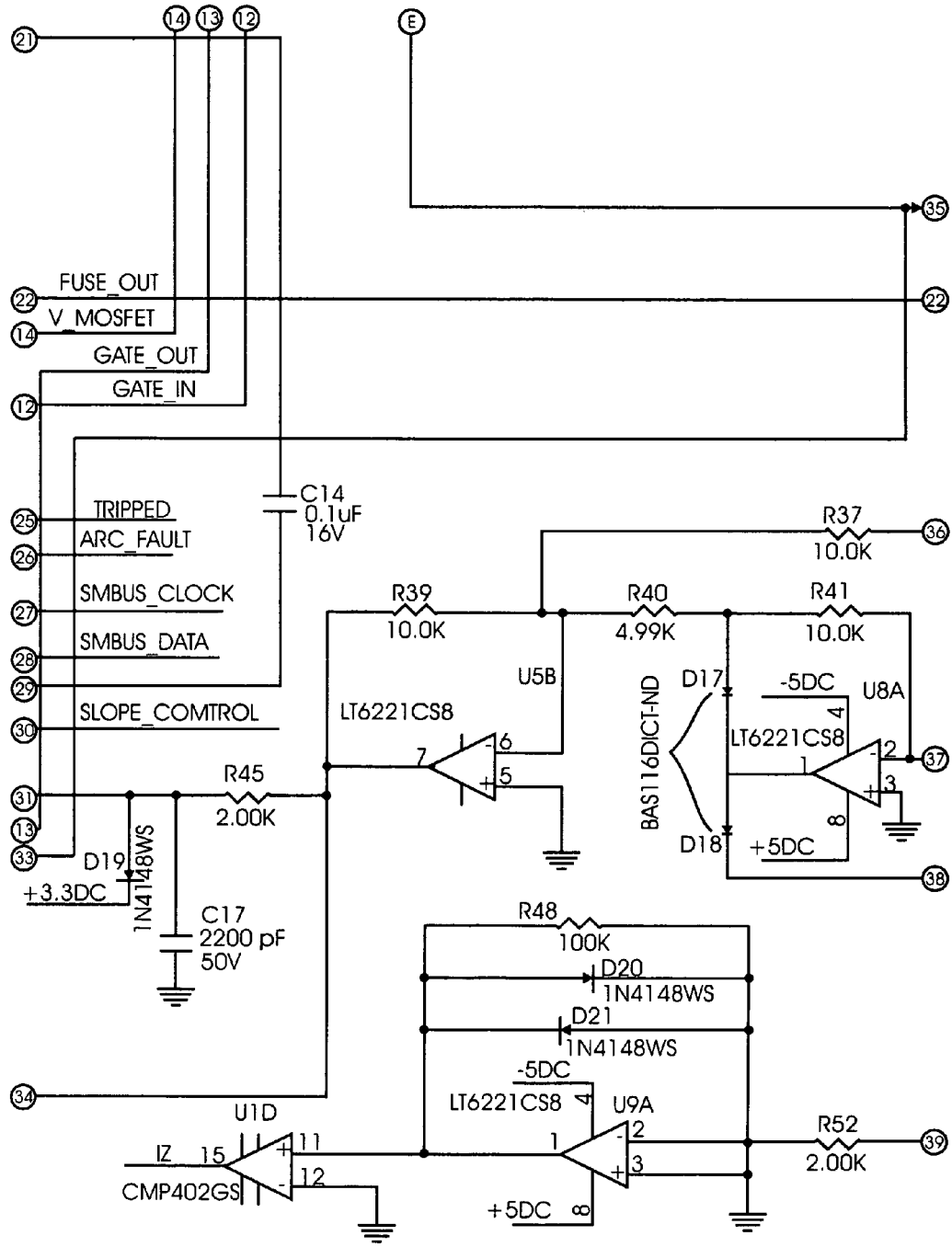
FIG. 9A(8)

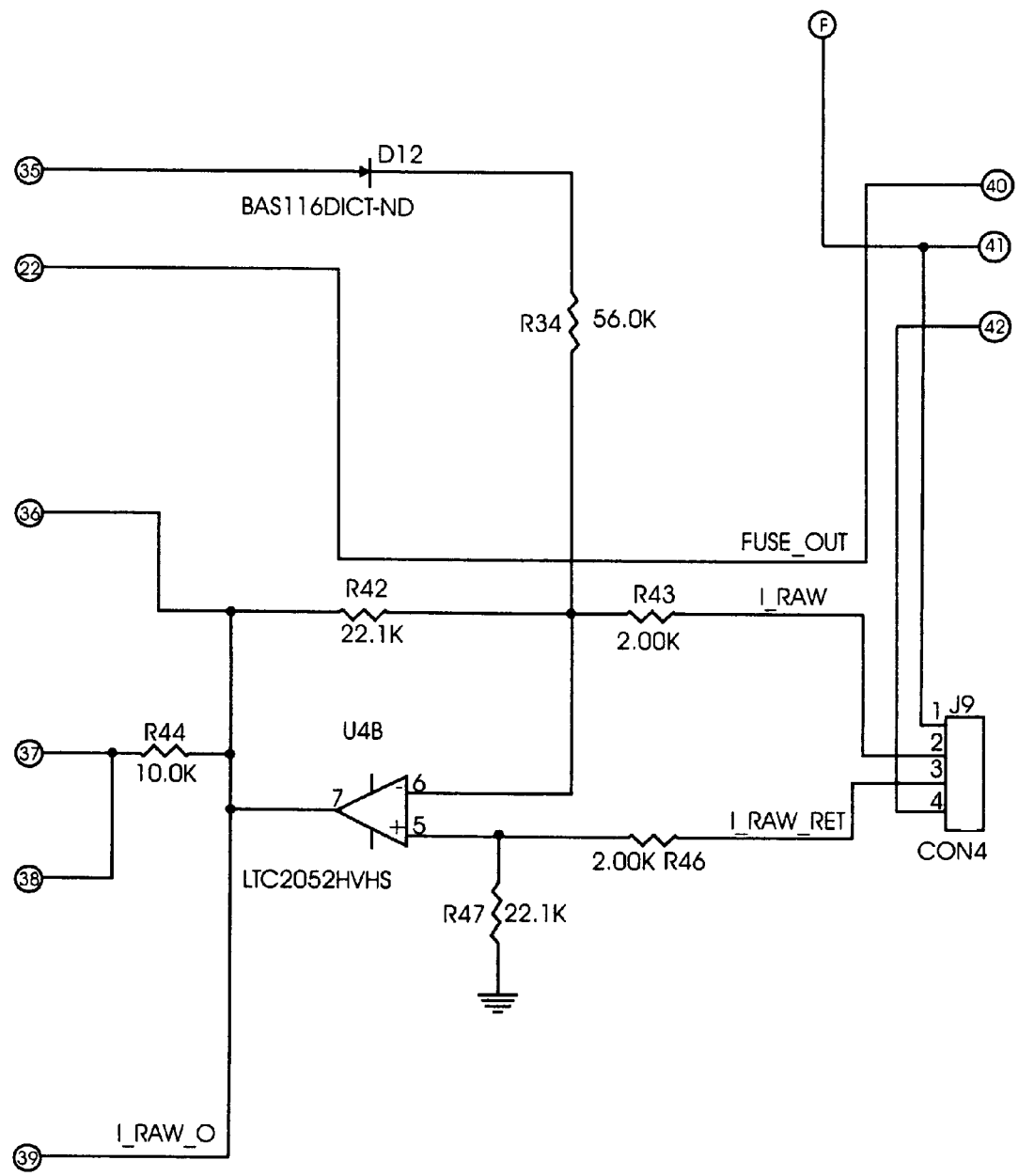
FIG. 9A(9)

FIG. 9A(10)

| 9A(1) | 9A(2) | 9A(3) | 9A(4) | 9A(5) |
|---|---|---|---|---|
| 9A(6) | 9A(7) | 9A(8) | 9A(9) | 9A(10) |

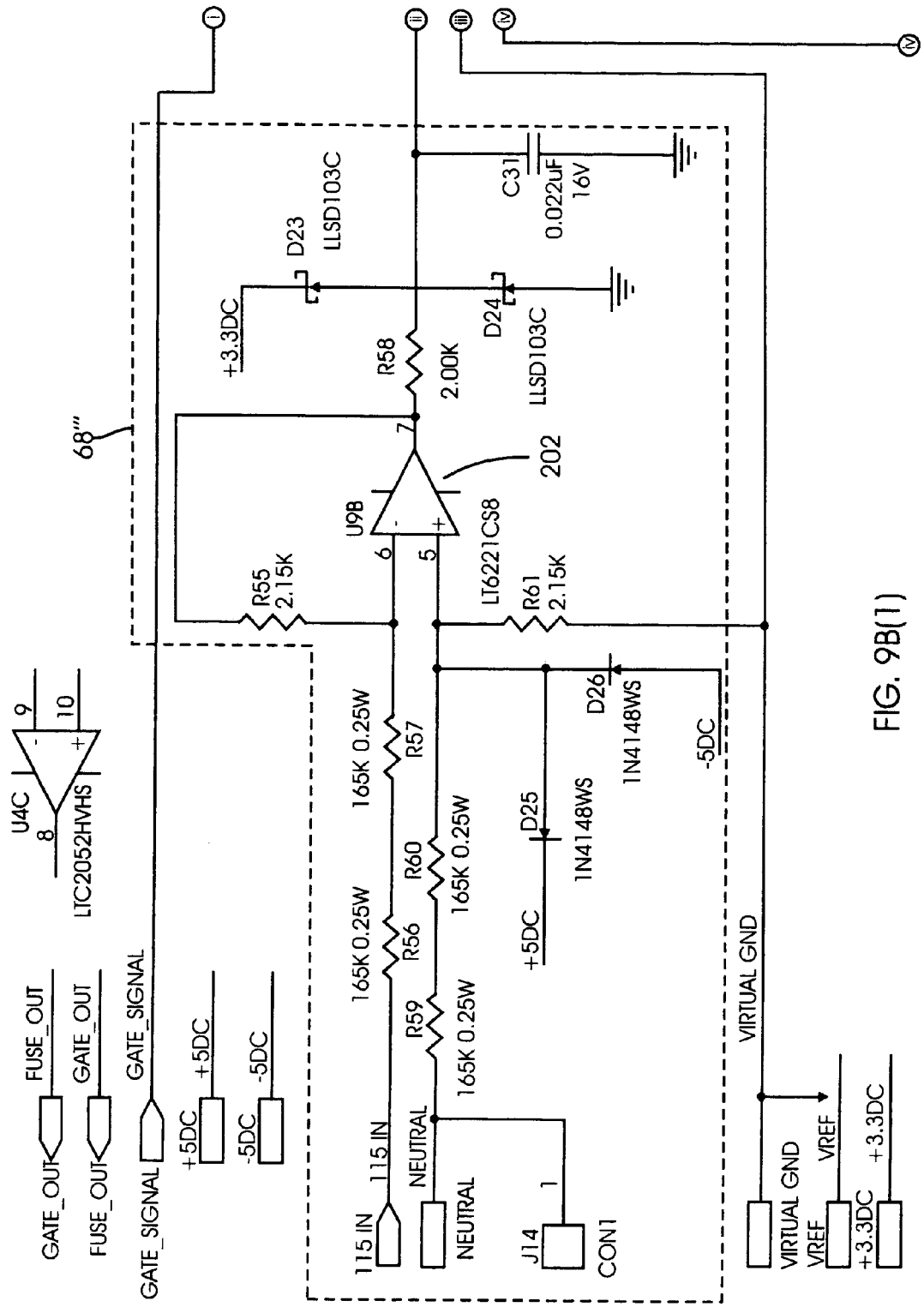
FIG. 9B(1)

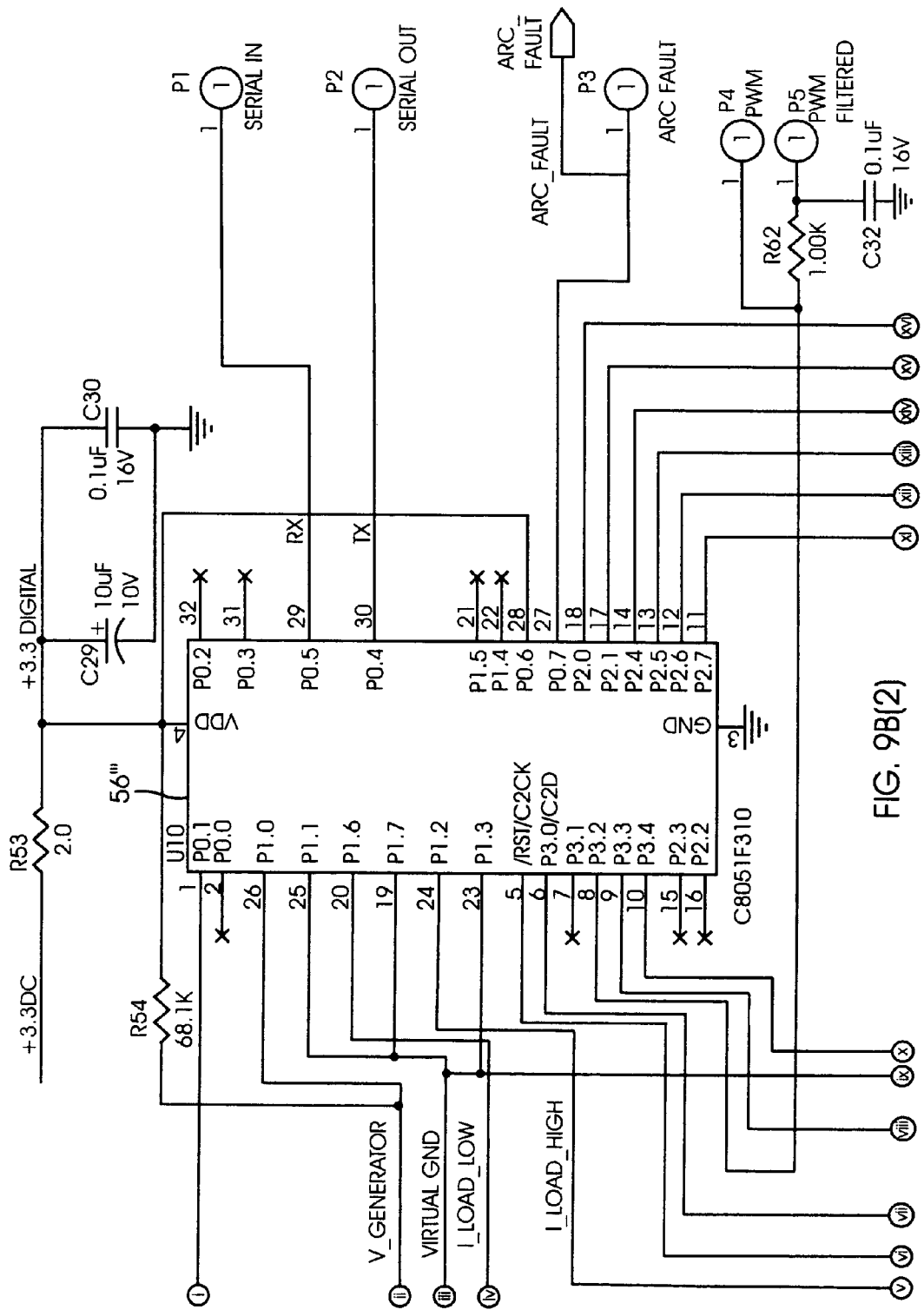
FIG. 9B(2)

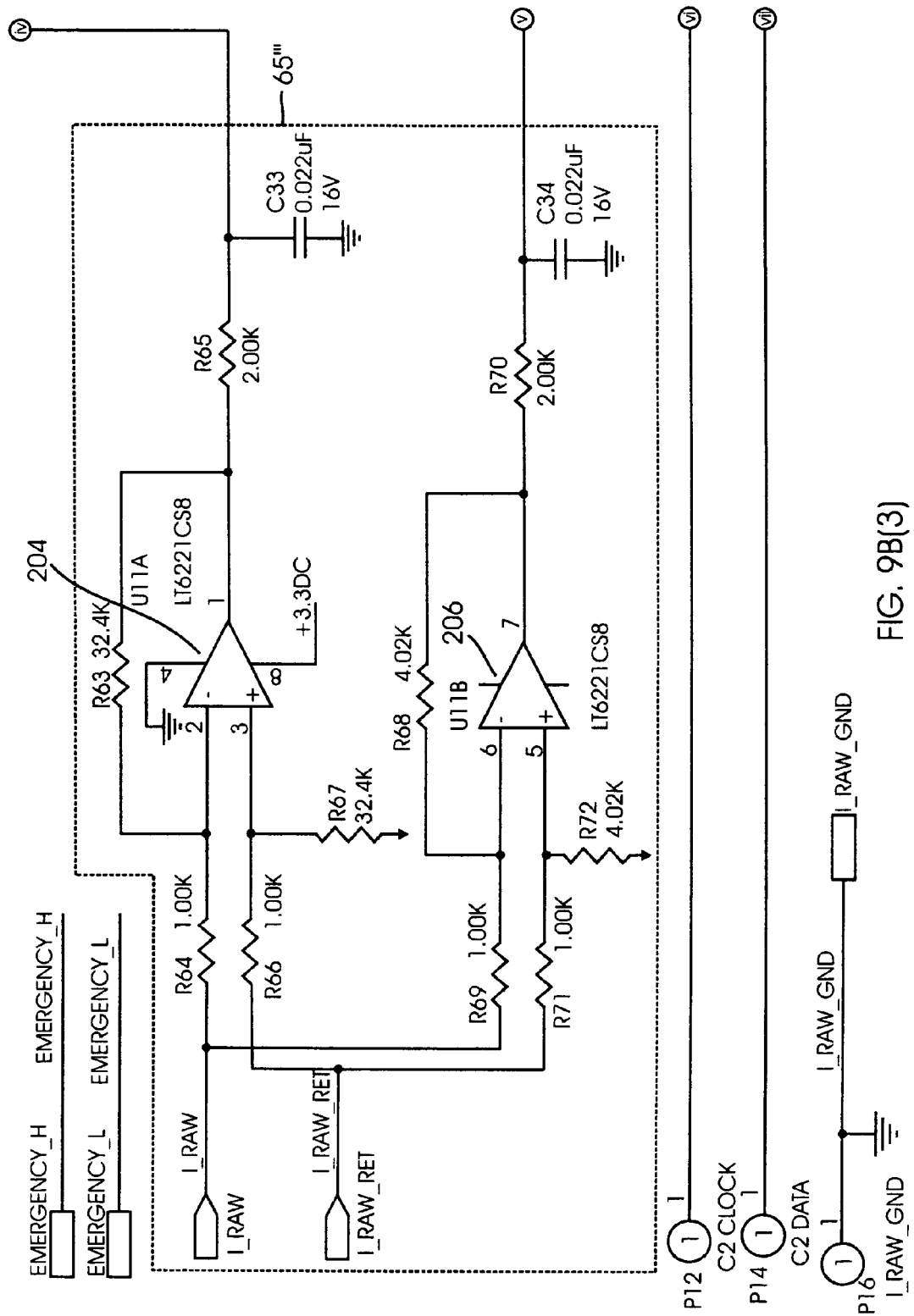
FIG. 9B(3)

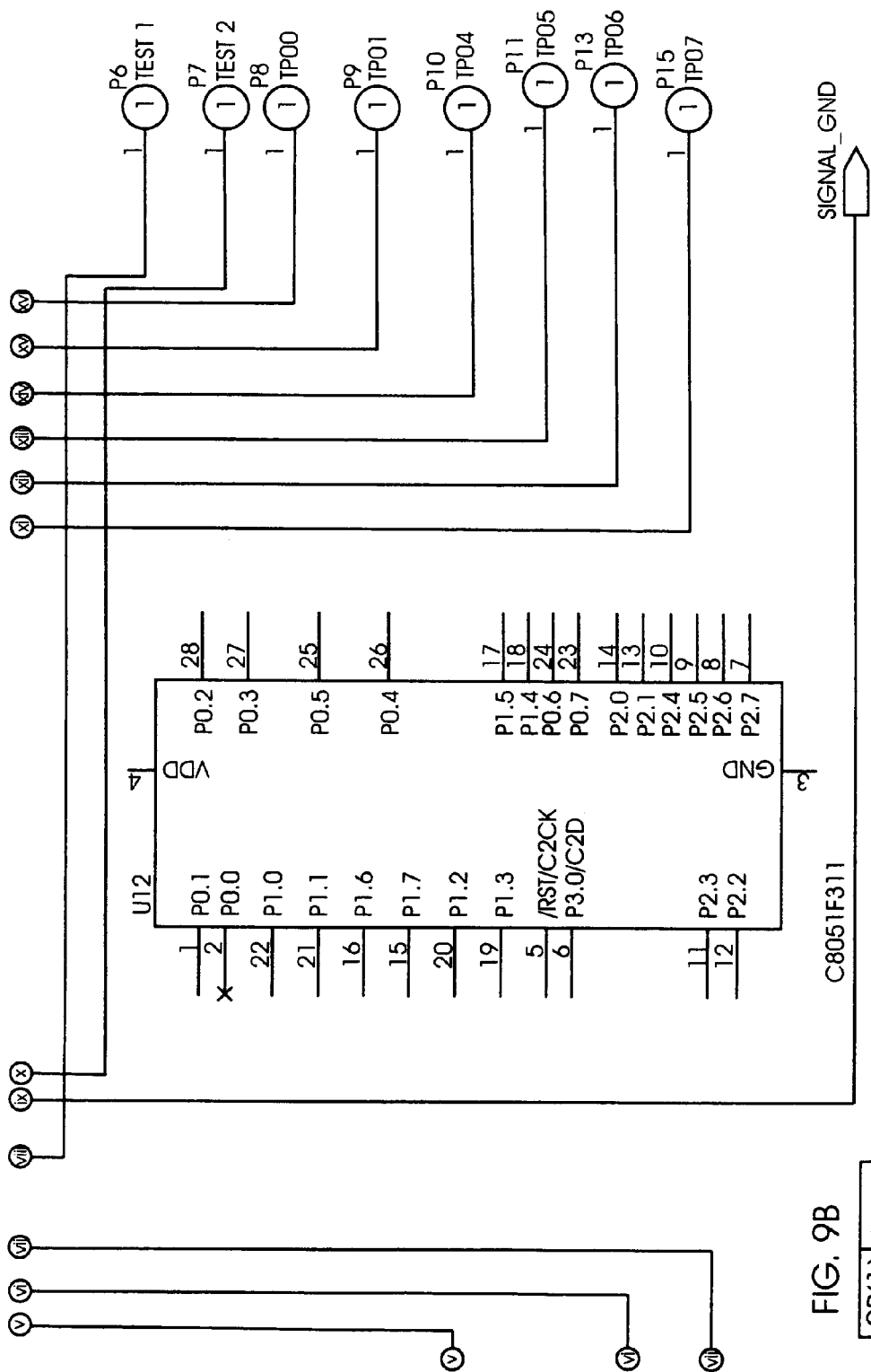

FIG. 12

POWER DISTRIBUTION SYSTEM USING SOLID STATE POWER CONTROLLERS

RELATED APPLICATIONS

The present invention claims priority to U.S. Provisional Patent Application Ser. No. 60/653,846 filed on Feb. 16, 2005, the disclosure of which is incorporated herein by reference in its entirety.

FIELD OF THE INVENTION

The present invention relates generally to the use of solid state power controllers in a power distribution system and more specifically to the use of solid state power controllers to supply loads in a vehicle power distribution system.

BACKGROUND

Power distribution systems are responsible for distributing power from generators to loads as required. Many power distribution systems are configured to have a primary distribution system that distributes power from one or more generators to one or more electrical busses. The portion of the power distribution system that distributes power from the electrical busses to the loads is often referred to as the secondary distribution system. Typically, electronic components such as relays or solid state power controllers are used to control the supply of power to the loads.

SUMMARY OF THE INVENTION

Solid state power controllers are described that include a switch controlled by a microcontroller and communication contacts. In one aspect of the invention, the microcontroller is galvanically isolated from the communication contacts using magnetoresistive isolation.

One embodiment of the invention includes a solid state switch electrically connectable between the power connector and the load connector, where the switch includes an input, circuitry for measuring a voltage at the power connector, the measuring circuitry configured to minimize a current drawn from the power connector by the measuring circuitry, a microcontroller coupled to the input of the solid state switch and isolation circuitry connected to create a galvanic barrier between the microcontroller and the at least one communication connector, wherein the microcontroller is configured to detect an overcurrent condition by comparing a trip constant to a time variable calculated value which is a function of a measured load current, a rated current and a threshold current.

In a further embodiment of the invention, the isolation circuitry comprises one or more magnetoresistive signal isolators.

In another embodiment of the invention, the solid state switch comprises a MOSFET.

In a still further embodiment of the invention, the microcontroller is configured to generate an input to the solid state switch in accordance with at least one predetermined operational characteristic.

In still another embodiment of the invention, one of the predetermined operational characteristics is a rated current.

In a yet further embodiment of the invention, one of the predetermined operational characteristics is a trip current threshold.

In yet another embodiment of the invention, the programmable microcontroller is programmed with instructions received from the external device after an initialization of the solid state power controller.

In a further embodiment again, the programmable microcontroller is programmed with instructions pre-stored in a memory inside the microcontroller prior to the initialization of the solid state power controller.

Another embodiment again also includes voltage sensing circuitry connected to the microcontroller and configured to sense the voltage of at least one terminal of the solid state switch.

A further additional embodiment also includes current sensing circuitry connected to the microcontroller and configured to sense the current flowing through the solid state switch.

Another additional embodiment also includes an arc fault microcontroller coupled to the programmable microcontroller and adapted to detect an arc fault in circuitry connected to the power connector or the load connector of the SSPC. In addition, the arc fault microcontroller is configured to respond to the sensing of an arc fault by generating a signal to open the solid state switch.

In a still yet further embodiment, the arc fault microcontroller detects arc faults with different levels of sensitivity.

In still yet another embodiment, the microcontroller is configured to detect an overcurrent condition.

In a still further embodiment again, an external device is connected to at least one of the communications connectors.

In still another embodiment again, the external device is a microcontroller.

A still further additional embodiment includes a plurality of solid state power controllers, each having a power connector and a load connector and at least one communication connector, an external microcontroller connected to each solid state power controller via the at least one communication connector. In addition, each solid state power controller includes an internal microcontroller that is connected to the at least one communication connector via isolation circuitry, where the isolation circuitry creates a galvanic barrier between the internal microcontroller and the external microcontroller, where each solid state power controller is galvanically isolated from the next solid state power controller by the isolation circuitry; and where the internal microcontroller is configured to detect an overcurrent condition by comparing a trip constant to a time variable calculated value which is a function of a measured load current, a rated current and a threshold current.

In still another additional embodiment, the isolation circuitry includes a magnetoresistive signal isolator.

In another further embodiment, each solid state power controller includes a solid state switch and the microcontroller in each solid state power controller is configured to control the operation of the solid state switch.

In still another further embodiment, the external microcontroller is configured to send messages to the microcontrollers in the solid state power controllers and the microcontrollers of the solid state power controllers are configured to respond to the messages sent by the external microcontrollers.

In yet another further embodiment, at least one of the microcontrollers is configured to modify the manner in which the operation of the solid state switch is controlled in response to receipt of a predetermined message from the external microcontroller.

Another further additional embodiment also includes a keypad connected to the external microcontroller and at least one LED connected to each of the solid state power controllers.

In still another yet further embodiment, the keypad includes four buttons.

In still another further additional embodiment, each solid state power controllers is connected to three LEDs.

In still another further embodiment again, the external microcontroller is configured to send messages to solid state power controllers in response to input received via the keypad.

In yet another further additional embodiment, the internal microcontrollers of solid state power controllers are configured to generate signals that illuminate the LEDs and convey information to the user.

Yet another further embodiment again also includes a computer connected to the external microcontroller. In addition, the computer generates a graphical user interface that conveys information concerning the operational characteristics of the solid state power controller to the user and enables the modification of the operational characteristics of a solid state power controller in response to instructions from the user.

BRIEF DESCRIPTION OF THE DRAWINGS

FIG. 12 is a screen shot of a display generated by a graphical user interface in accordance with an embodiment of the present invention;

DETAILED DESCRIPTION OF THE INVENTION

Figure 1:
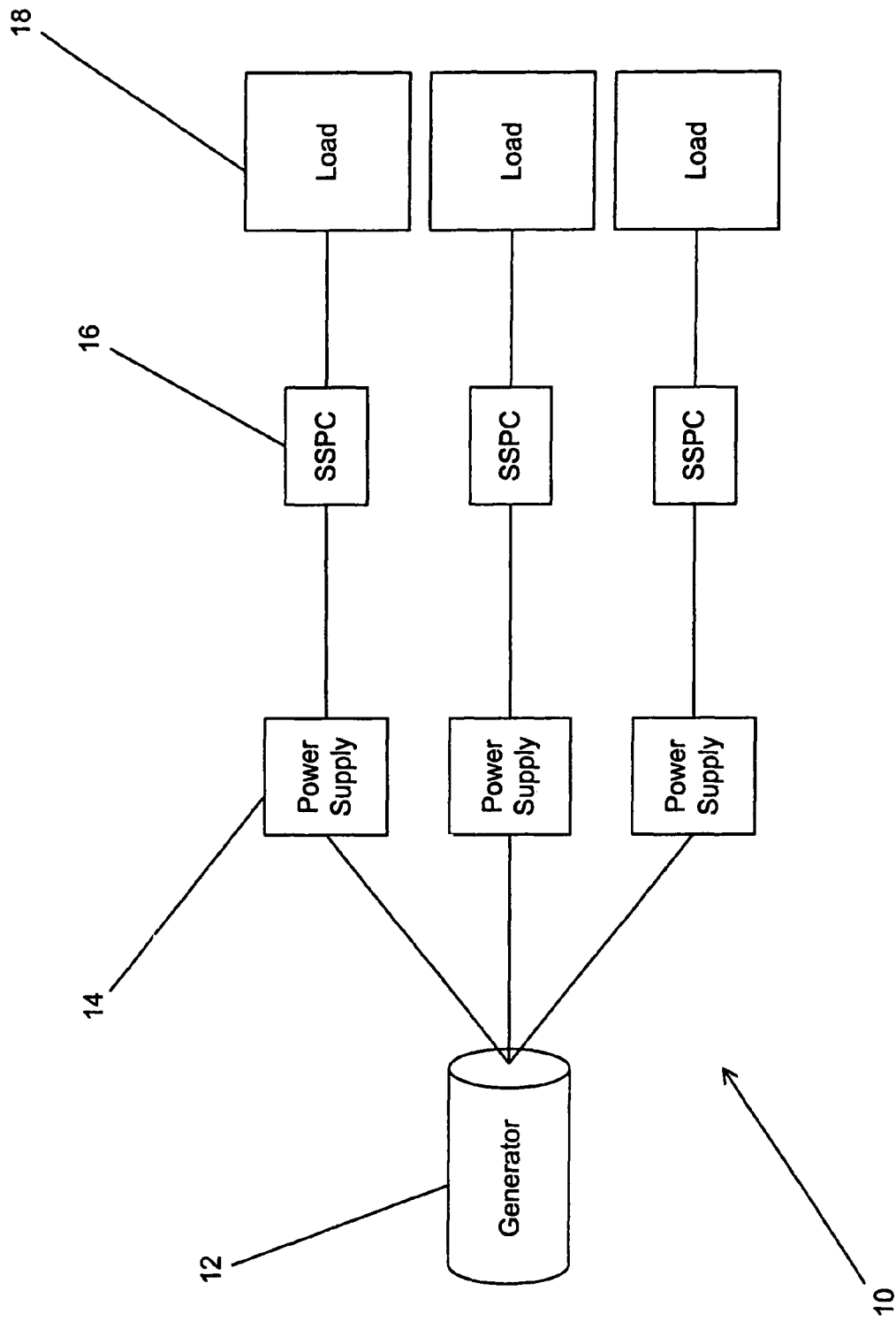
FIG. 1 is a schematic view of a power distribution system in accordance with an embodiment of the present invention.

Referring now to the drawings, embodiments of power distribution systems in accordance with the present invention are illustrated that include solid state power controllers (SSPCs) possessing solid state switching circuitry and microcontrollers. In many embodiments, the SSPCs include circuitry that protects a load connected to the SSPC from damage due to various types of faults. In one embodiment, the SSPC includes a dedicated microcontroller to protect loads from arc faults. In other embodiments, loads are protected from ground faults or are protected from a variety of faults and with differing levels of sensitivity.

In several embodiments, the SSPCs include circuitry enabling communication with external devices. As part of the communication circuits, the SSPCs can include a galvanic barrier created using magnetoresistive isolator to electrically isolate the SSPC from external devices. In a number of embodiments, the SSPC microcontroller configures the operational characteristics of the SSPC in response to instructions received from an external device. A variety of embodiments include external devices that generate a user interface for the configuration of SSPCs. One example of a user interface in accordance with the present invention combines a four button keypad and light emitting diodes (LEDs) to communicate information between a user and the SSPCs.

A power distribution system in accordance with an embodiment of the present invention is illustrated in FIG. 1. The power distribution system 10 includes a generator that generates power, which is provided to power supplies 14. The power supplies can provide power via direct connections or power busses to one or more SSPCs 16. The SSPCs control the supply of power to loads 18. In some systems, the portion of the power distribution system that distributes power from the generators to the power supplies is referred to as the primary distribution system and the portion that delivers power from the power supplies to the loads is referred to as the secondary power distribution system. In many instances, a number of SSPCs can be grouped together to form a power distribution assembly (PDA). Locating a number of SSPCs together can decrease the amount of aircraft wiring. In addition, a single device such as a microcontroller can be used to coordinate the operational characteristics of each of the SSPCs.

Figure 2:
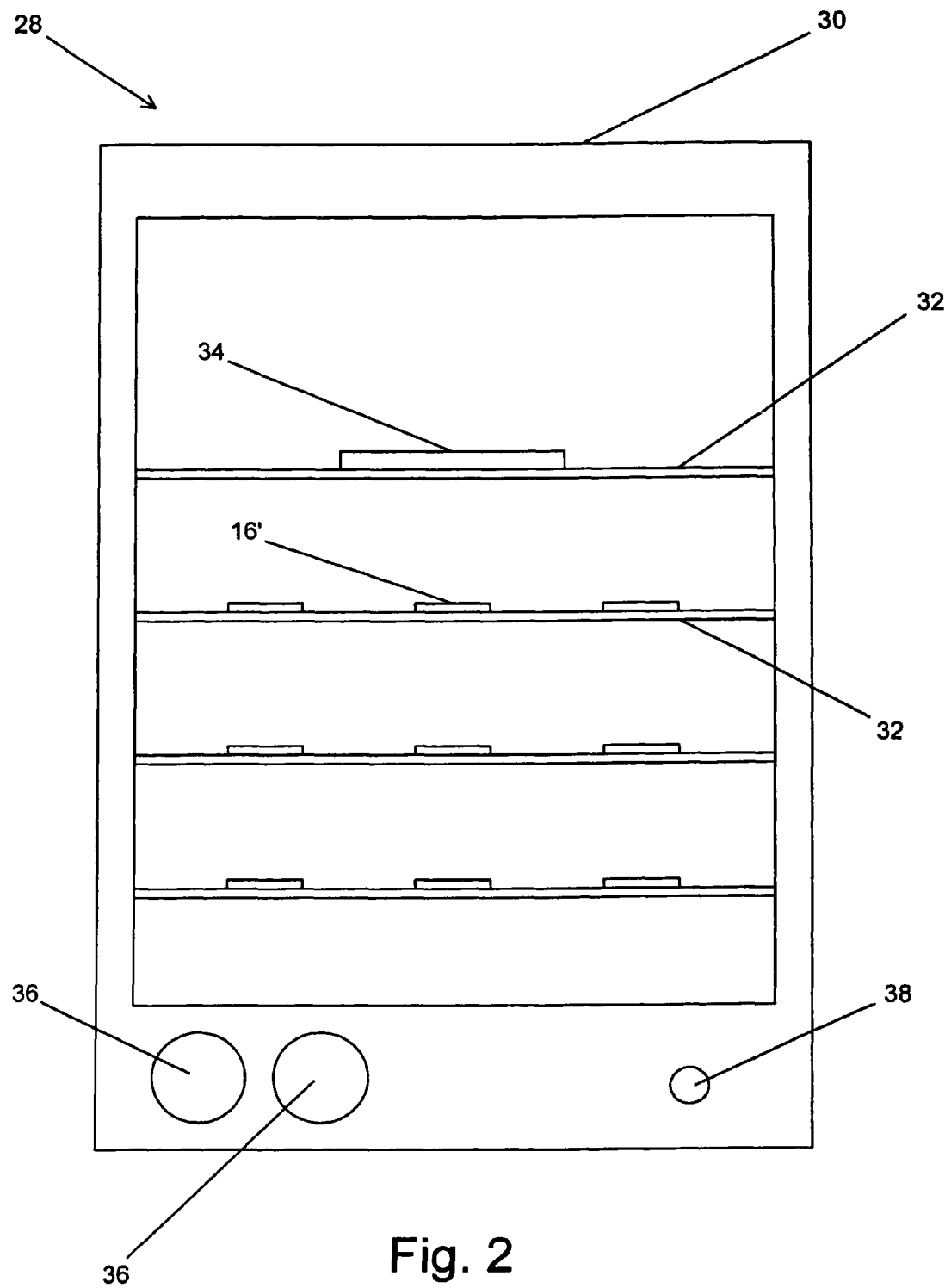
FIG. 2 is a schematic front view of a power distribution assembly in accordance with an embodiment of the present invention, which includes multiple solid state power controllers.

A PDA in accordance with an embodiment of the present invention is illustrated in FIG. 2. The PDA 28 includes a cabinet 30 housing a number of printed wiring boards 32. At least one of the printed wiring boards includes an SSPC 16' in accordance with the present invention and another of the printed wiring boards can include a microprocessor 34. The various printed wiring boards communicate via connections (not shown) provided in the backplane of the cabinet. In addition, the cabinet includes connections 36 for power lines that can be switched by the SSPCs within the cabinet to supply and remove power from specified loads and communication lines 38 that can be used by the PDA to communicate with external devices (not shown). In one embodiment, a printed wiring board can include a single SSPC. In other embodiments, multiple SSPCs can be included on a single printed wiring board.

In many embodiments, one or more of the wiring boards includes LEDs (not shown) to provide information concerning one or more of the SSPCs. Including LEDs associated with each SSPC that indicate whether the SSPC is on or off and whether the SSPC has tripped enables the construction of a PDA that does not include an additional visual display. The PDA can also include a small keypad, which can be used to control the operation of the SSPCs via the microcontroller.

The variety with which SSPCs, microcontrollers and I/O devices can be combined in accordance with the present invention is great. The particular architecture chosen often depends on the characteristics of the SSPC. The characteristics of a number of different embodiments of SSPCs in accordance with the present invention and examples of PDA architectures are discussed below.

Figure 3:
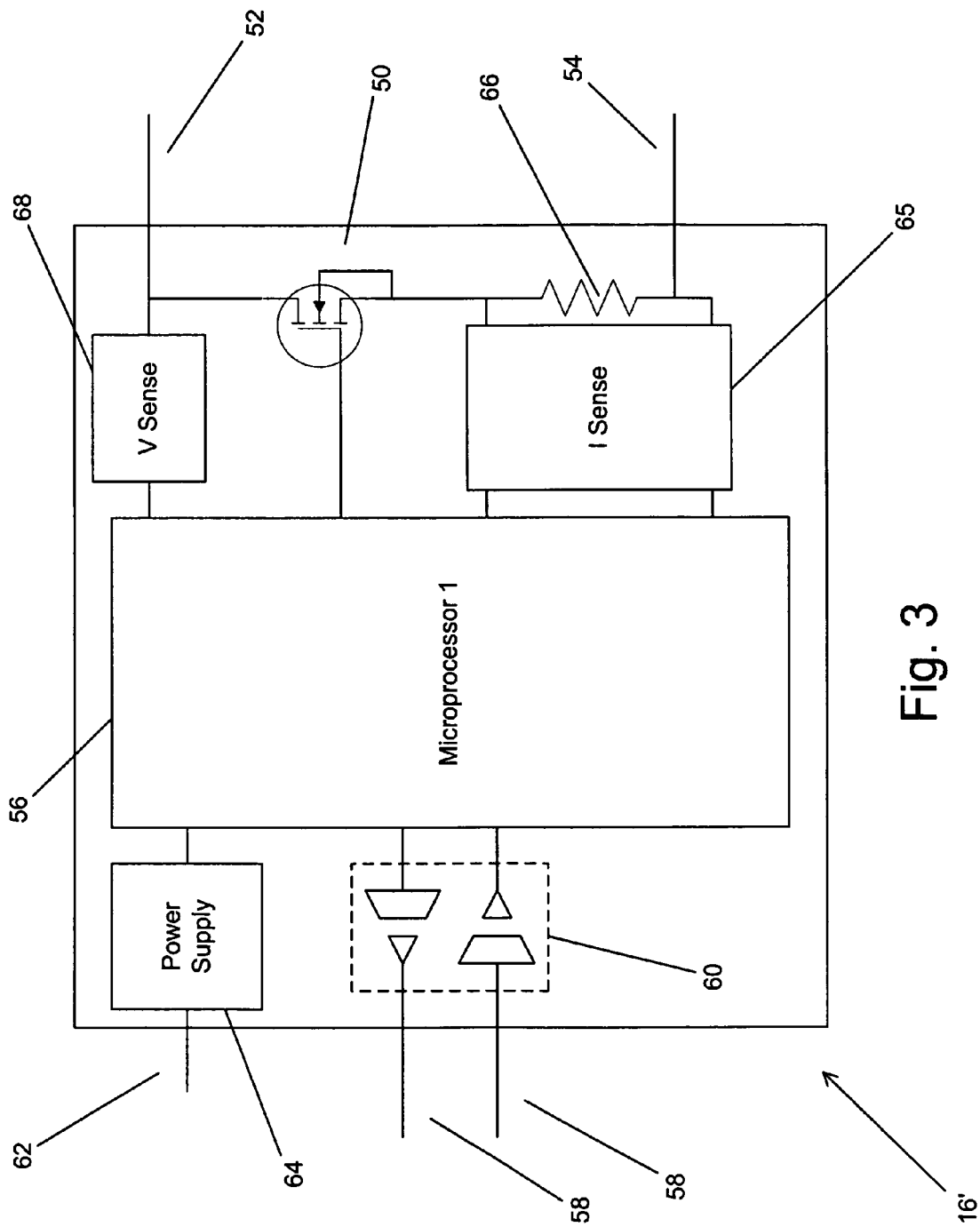
FIG. 3 is a schematic block diagram of a solid state power controller in accordance with an embodiment of the present invention.

An SSPC in accordance with an embodiment of the present invention is illustrated in FIG. 3. The SSPC 16' is constructed on a single printed wiring board including a switch 50 capable of connecting a power input 52 to a power output 54. Typically, the switch is implemented using a MOSFET. The SSPC also includes a microcontroller 56 that controls the operation of the switch.

In several embodiments, the microcontroller is connected to the power line via circuitry that enables the SSPC to monitor the power supplied through the SSPC. The microcontroller can be programmed with information concerning the desired characteristics of the power supplied via the SSPC and can open the switch in response to the power within the line attaining undesirable characteristics. In the embodiment illustrated in FIG. 3 the microcontroller monitors the line using current sensing circuitry 65 connected across a shunt resistor 66 that enables the microcontroller to measure the current flowing through the line 52 and voltage sensing circuitry 68 that enables the microcontroller to monitor the voltage of the power being supplied via the line 52.

In several embodiments, the SSPC includes connections 58 that enable the microcontroller to communicate with external devices. The connections include isolation circuitry 60 that creates a galvanic barrier between the microcontroller and external devices. In one embodiment, the galvanic barrier is established using magnetoresistive technology (discussed below). In other embodiments, a galvanic barrier can be created using other types of isolation such as optical isolation.

In several embodiments, the SSPC also includes a connection 62 enabling a power input to be connected to a power supply 64 that provides the power needs of the microcontroller. In one embodiment, the power supply receives 5 Vdc power and converts the power to 3.3 Vdc power.

Figure 4:
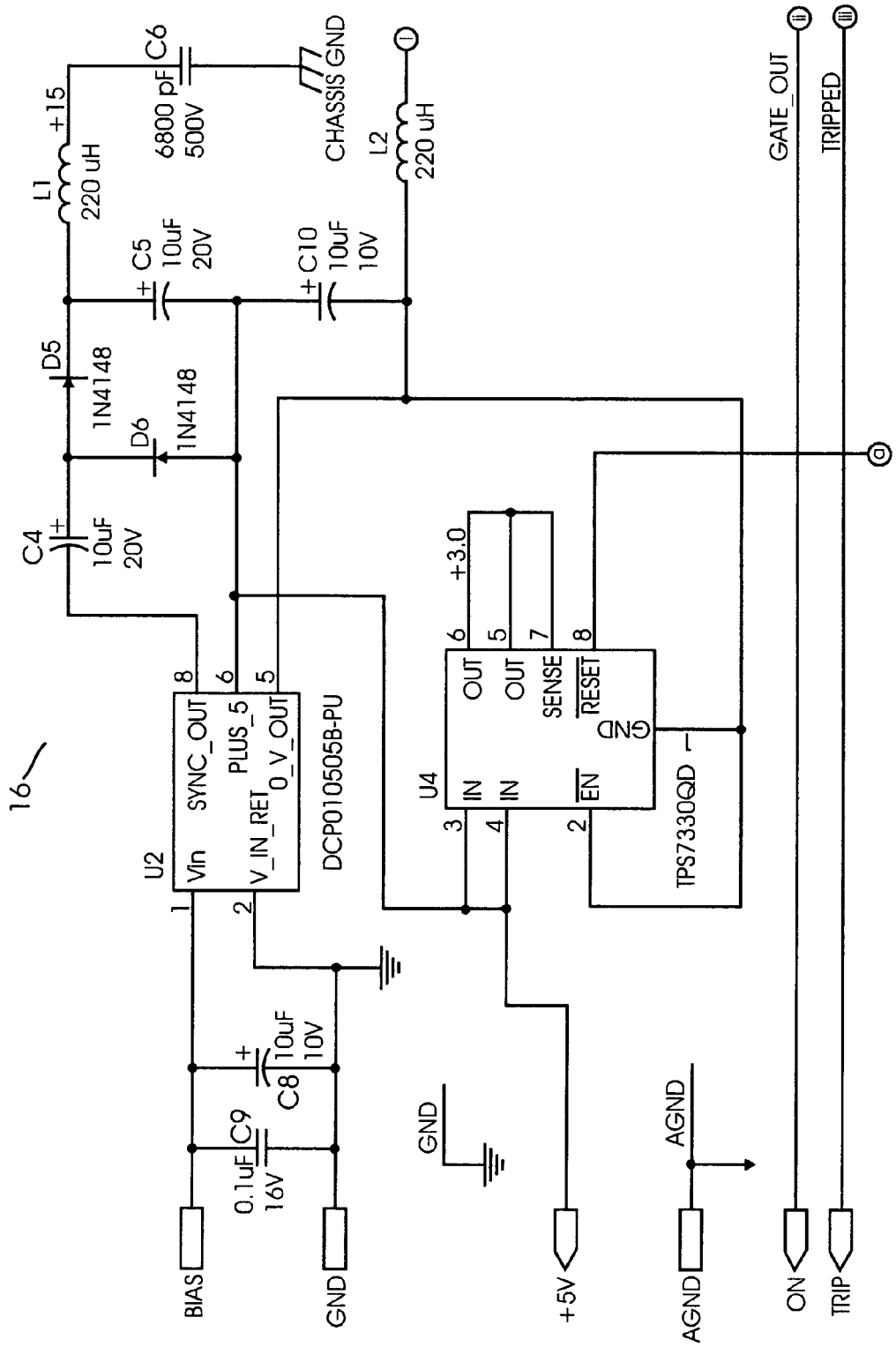
FIGS. 4(1)-4(4) are schematic circuit diagrams of a DC solid state power controller in accordance with an embodiment of the present invention.
Figure 4:
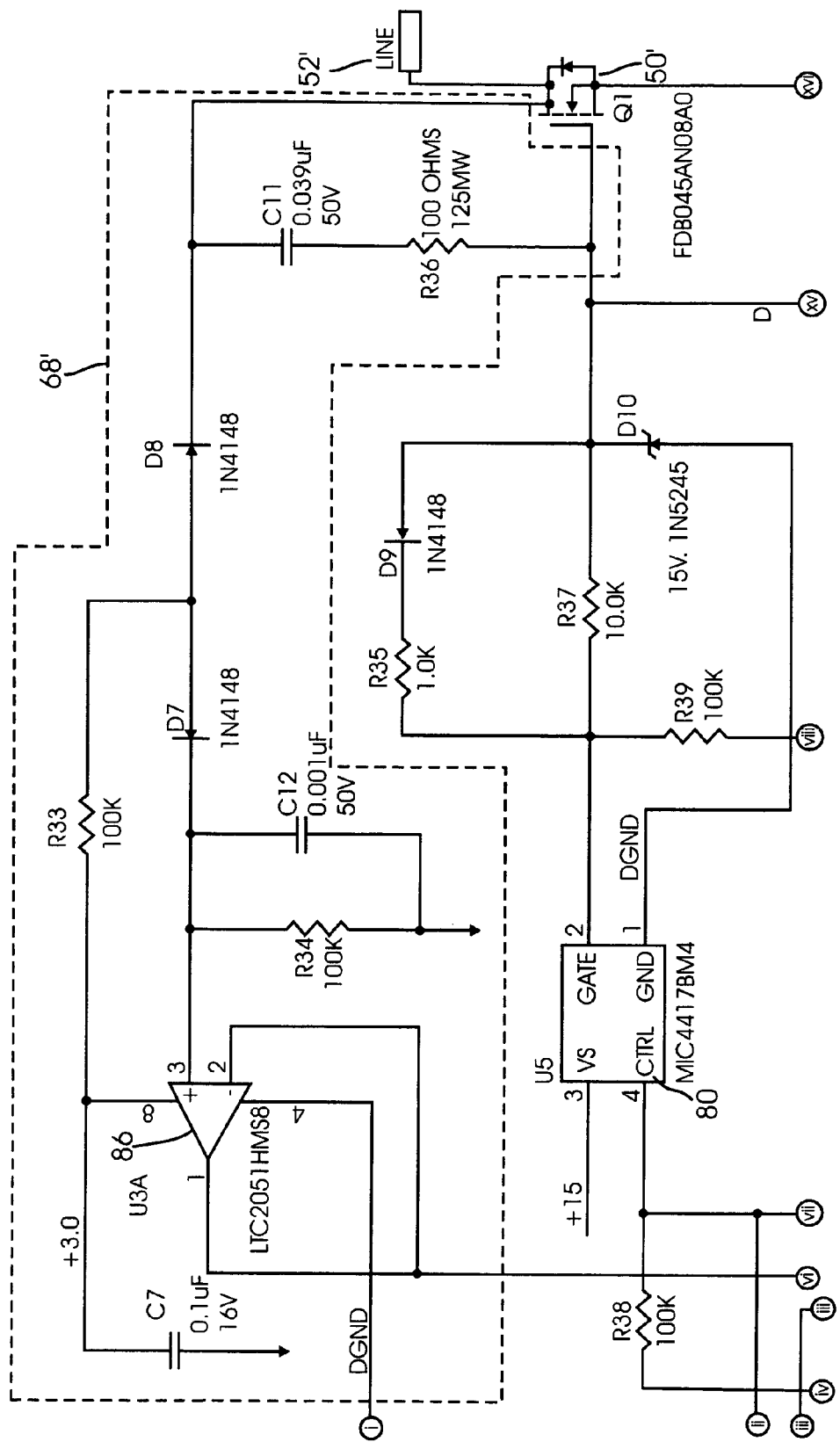
Figure 4:
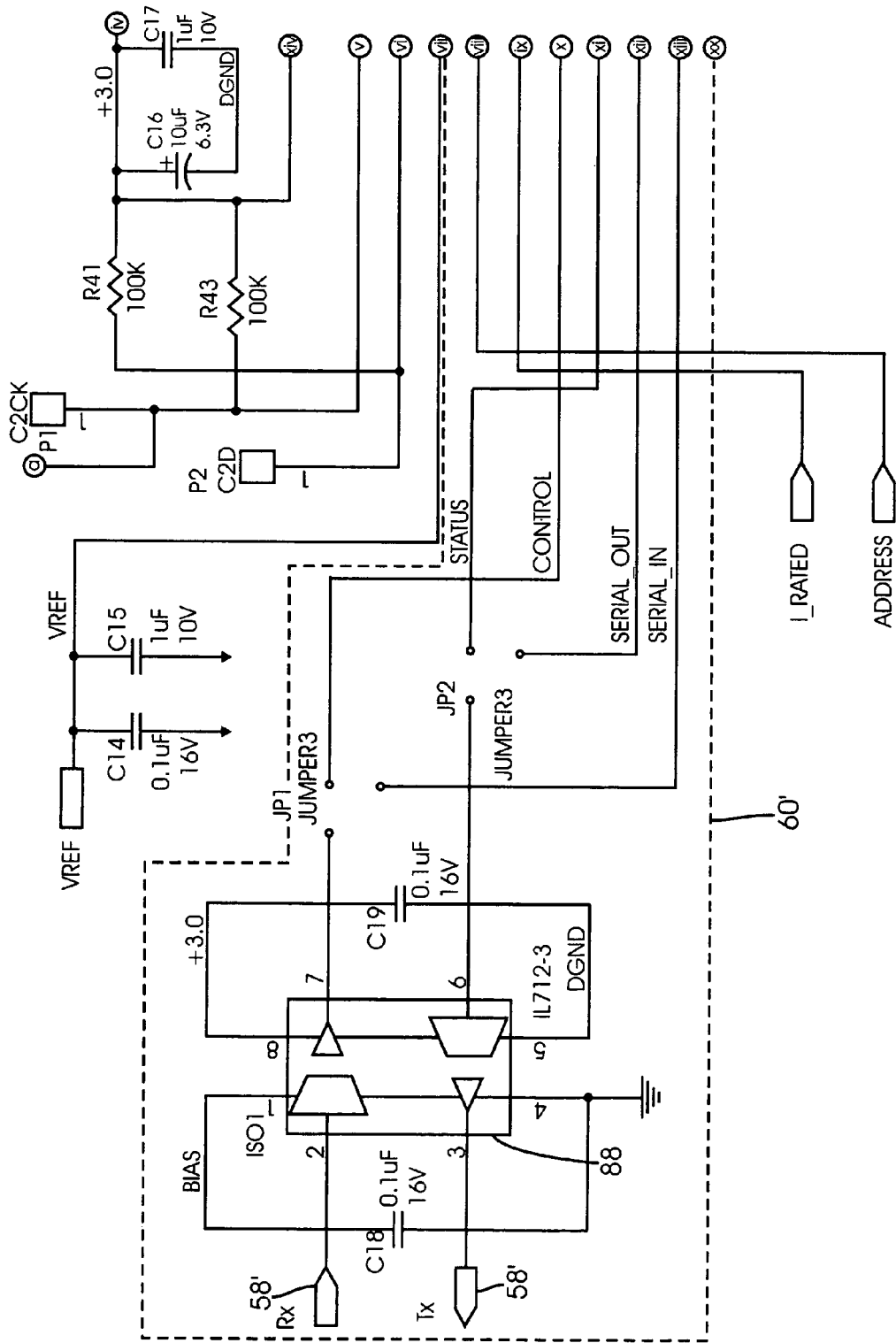
Figure 4:
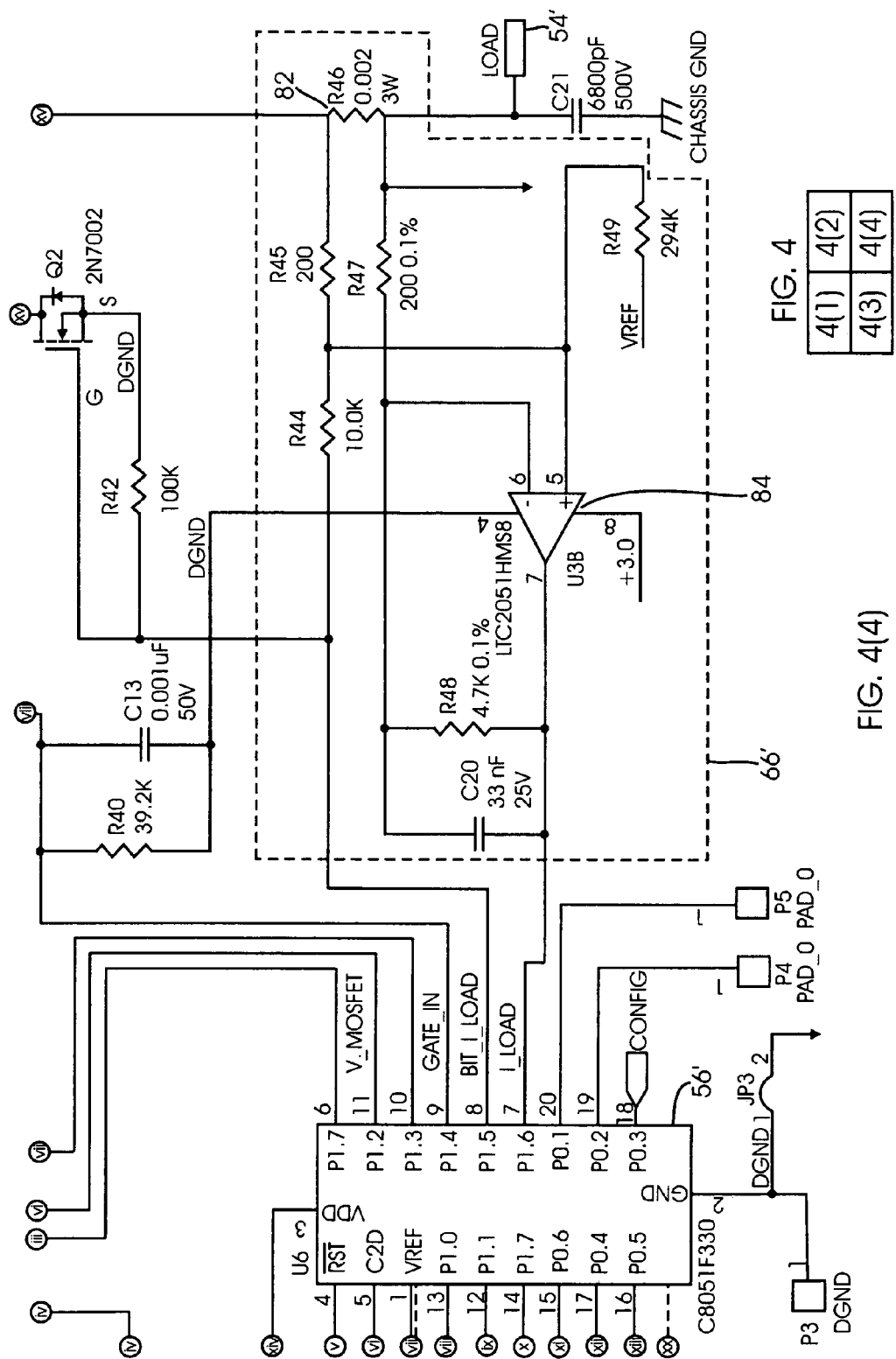

A schematic circuit diagram of an embodiment of a DC SSPC in accordance with the present invention is illustrated in FIGS. 4(1)-4(4). The SSPC includes a MOSFET 50' that switches power from the line 52' to the load 54'. The gate of the MOSFET 50' is connected to a microcontroller 56' via a MOSFET driver 80. The microcontroller is implemented using a C8051F330 microcontroller manufactured by Silicon Laboratories, Inc. of Austin, Tex. The MOSFET driver is implemented using a MIC4417BM4 manufactured by Micrel, Inc. of San Jose, Calif. In other embodiments, the microcontroller and the MOSFET driver can be implemented using equivalent devices.

The microcontroller is also connected to circuitry 66' capable of measuring the current flowing between the line 52' and the load 54' when the switch 50' is closed. The circuitry includes a shunt resistor 82. The voltage across the shunt resistor is measured using a comparator 84 which is also configured to act as a low pass filter. The output of the comparator is provided as an input to the microcontroller. In other embodiments, other methods of sensing the current between the line and the load can be used.

The microcontroller is connected to circuitry 68' capable of measuring the voltage of the line. The circuitry includes a comparator 86 that is configured to provide a voltage below a first threshold when the MOSFET is closed and above a second threshold when the MOSFET is open. In the embodiment illustrated in FIG. 4(4), the voltage sensing circuitry 68' minimizes and/or eliminates the current drawn, by the voltage sensing circuitry 68', from the line at the switch 50'. More specifically, in the embodiment illustrated in FIG. 4(4), reverse biased diode D8 minimizes and/or eliminates current flowing into the voltage sensing circuitry 68'.

The microcontroller is also connected to circuitry 60' that enables the microcontroller to transmit and receive information with external devices. The circuitry includes a pair of mangetoresistive signal isolators 88, such as the component identified by the part number IL712-3 manufactured by NVE Corporation of Eden Prairie, Minn. The magnetoresistive isolators use "spintronics", which is a nanotechnology that uses electron spin to transmit information. The magnetoresistive signal isolators create a galvanic barrier between the SSPC 16" and other devices.

As discussed above SSPCs in accordance with the present invention can be configured to communicate with external devices. An SSPC can transmit a variety of information such as the status of the SSPC and the characteristics of the power being supplied via the SSPC. In addition to providing information, SSPCs can receive information including commands from external devices. The presence of a microcontroller (or equivalent application specific circuitry) within the SSPC enables the configuration of the SSPC to be modified in response to instructions from an external device.

Figure 5:
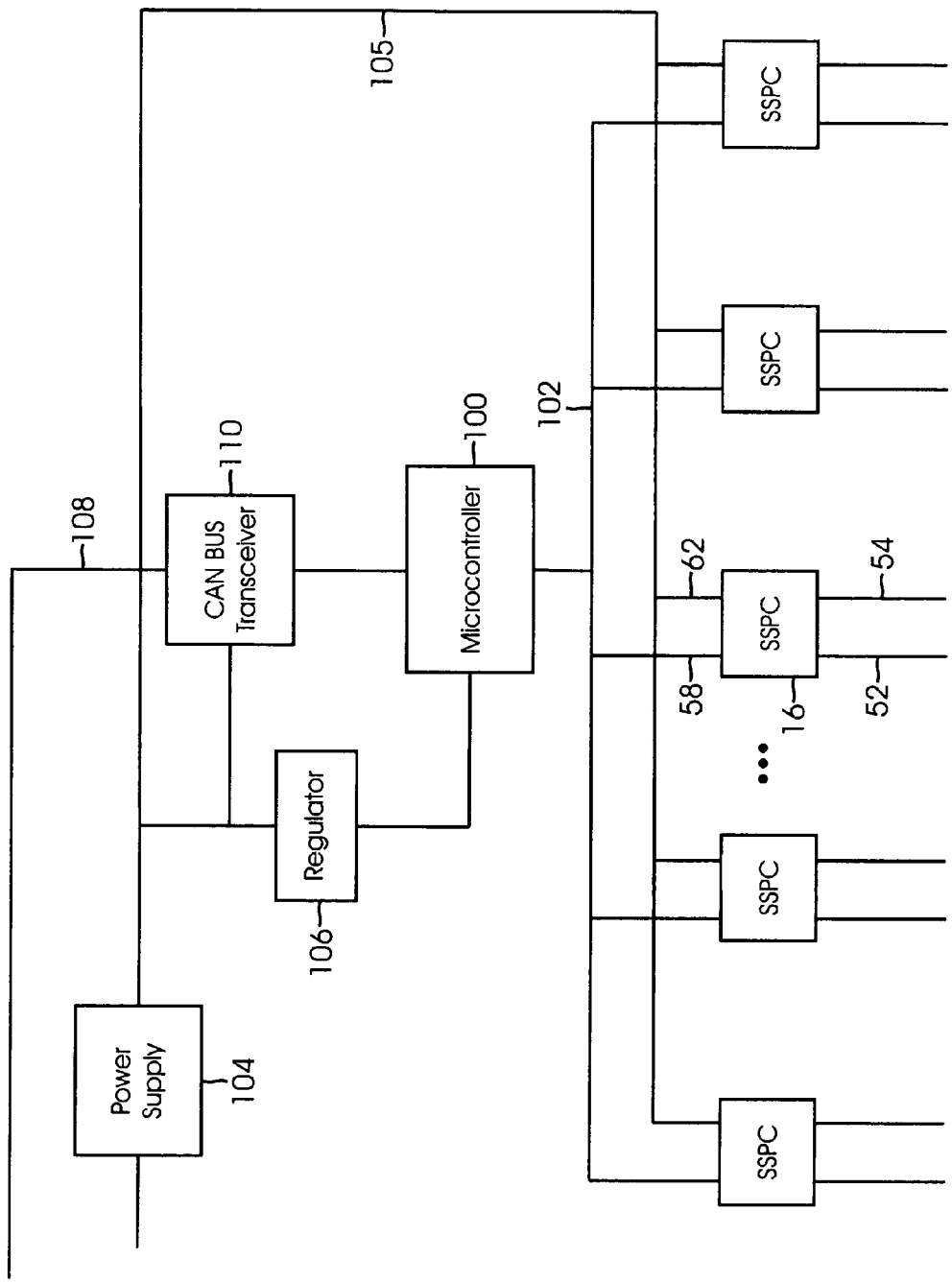
FIG. 5 is a schematic block diagram of a configuration in accordance with an embodiment of the present invention including a microcontroller and a number of solid state power controllers.

An embodiment of a system in accordance with the present invention including a number of SSPCs connected to a single external device, which is a microcontroller, is illustrated in FIG. 5. The microcontroller 100 is connected to the connections 58 of the SSPCs 16 via a bus 102. In one embodiment, the bus is a serial interface bus such as a UART or CAN (Controller Area Network) bus. In other embodiments, the microcontroller 100 can communicate directly with the SSPCs via discrete signal lines. As discussed above, circuitry within the SSPC creates a galvanic barrier between the external microcontroller 100 and the microcontroller within the SSPC. In the illustrated embodiment, both the microcontroller and the SSPCs are provided with power from a power supply 104 via a power bus 105. In one embodiment, a regulator 106 can be used to further condition the power from the power supply for use by the microcontroller. In several embodiments, the microcontroller is configured to communicate with external devices such as maintenance computers or other vehicle systems. In the illustrated embodiment, the microcontroller is connected to a bus 108 that conforms to the CAN protocol via a CAN transceiver 110.

An important function of any power controller is to controllably provide power from a power source to a load. Many power controllers include circuitry that monitors the characteristics of the supplied power and disconnect the power supply in the event that the characteristics do not satisfy predetermined criteria. As discussed above, embodiments of SSPCs in accordance with the present invention can be configured for specific operational requirements. Various aspects of an SSPC's configuration can be determined through hardware, firmware or commands received in serial data mode. Both the hardware and firmware are determined during manufacture, whereas commands that modify the SSPC's configurations can be provided to an SSPC throughout its operation. As an example of how various characteristics of an SSPC can be configured, an SSPC can have a maximum rated current set in hardware, which defines the upper operational limits of the SSPC. The same SSPC can also store a value indicative of a rated current, which represents the desired rated current of the SSPC and can be any value up to the maximum rated current.

Initially, the rated current can be provided as a default value in firmware, which can be modified during operation by the receipt of appropriate commands.

SSPCs in accordance with embodiments of the present invention can be configured to detect a variety of different faults. In addition, SSPCs can be reconfigured during operation to change fault responses and detect faults in new ways. One type of fault that can occur is an arc fault or ground fault. In several embodiments, the SSPC stores values representing a threshold current and a trip constant, which define the trip characteristics of the SSPC in response to an abnormal condition. In one embodiment the threshold current is 120% of the rated current and the trip constant is nine point nine seconds. The value of the threshold current and the trip constant can be modified during operation subject to limits imposed by the maximum rated current and the propagation delay of the circuitry within the SSPC.

Another fault that can occur is an overcurrent. Several embodiments of SSPCs in accordance with the present invention include software that monitors for overcurrents and removes power from the load when an overcurrent is detected. In one embodiment, the SSPC trips whenever the following statement is true:

$$\int_{t_0}^{t_1} \left[ (i^2 - I_{Threshold}^2) / I_{Rated}^2 \right] dt \leq K$$

Where
i is measured Load Current;
$I_{RATED}$ is the Rated Current;
$I_{THRESHOLD}$ is the Threshold Current; and
K is the trip constant.

The discrete implementation of this integral can be represented as follows:

$$\sum_{\Delta t} \left[ (i^2 - I_{Threshold}^2) / I_{Rated}^2 \right] dt \leq K$$

The above algorithms can be implemented in a manner that accommodates thermal memory and are often referred to as $i^2 t$ overcurrent faults.

Several embodiments of SSPCs in accordance with the present invention can be configured to provide an emergency trip. An example of an emergency trip is to trip the MOSFET in response to a load current of at least 10 times rated load current. Such a trip can occur within 300 μs. In other embodiments, the threshold and response times of emergency trips can be modified to suit a particular application.

Figure 6:
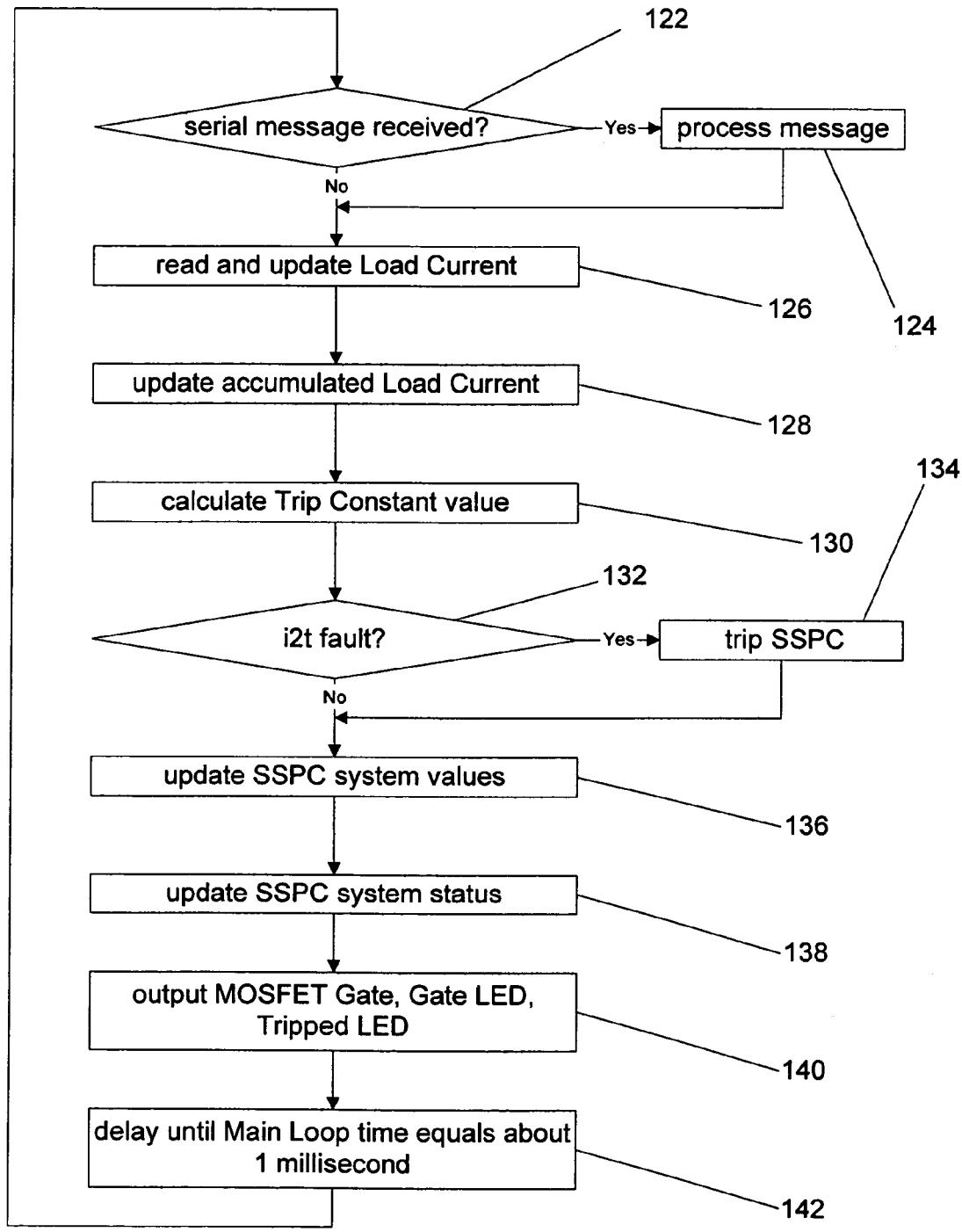
FIG. 6 is a flow chart illustrating the operation of a microcontroller in a solid state power controller in accordance with an embodiment of the method of the present invention.

A flow chart illustrating the operation of an embodiment of an SSPC in accordance with the present invention that is in communication with an external device and configured to trip in response to overcurrents is illustrated in FIG. 6. The process commences after initialization of the SSPC. The initialization process can involve establishing the operational characteristics of the SSPC such as the rated current of the SSPC, the threshold current and trip constant. The initialization can also include the performance of a built in test operation to verify that the SSPC is operating correctly. The initialization can often include setting timers for such things as the analog-to-digital converter (ADC). The timers determine the rate at which the current and voltage of the line are sampled. Once the initialization is complete, the SSPC enters the main operational loop 120.

Within the loop 120, the SSPC determines whether a message has been received (122). If a message is received, the message is processed (124). If no message is received or the processing of the message is complete, the load current is read (126). The value of the load current is used to update (128) a value representing the accumulated load current and to calculate (130) the value of the local trip constant (see discussion above).

A determination (132) is then made concerning whether the measured load current, accumulated load current and trip constant indicate the existence of an $i^2 t$ over current fault. If an $i^2 t$ over current fault is determined to have occurred, then power is removed (134) from the load. If the determination is made that an $i^2 t$ over current fault has not occurred or power has been removed from the load, then the system values of the SSPC are updated (136) and the system status of the SSPC is updated (138). In one embodiment, the system status of the SSPC includes information concerning trip status, current status, the output to the gate drive, whether the SSPC has failed short or failed open and whether there is an open load. Following the updates, the MOSFET Gate, Gate LED and Tripped LED outputs are generated (140) and the loop waits (142) until the total time for the present iteration of the loop has exceeded a predetermined duration. In the illustrated embodiment, the duration is approximately 1 millisecond.

Figure 7:
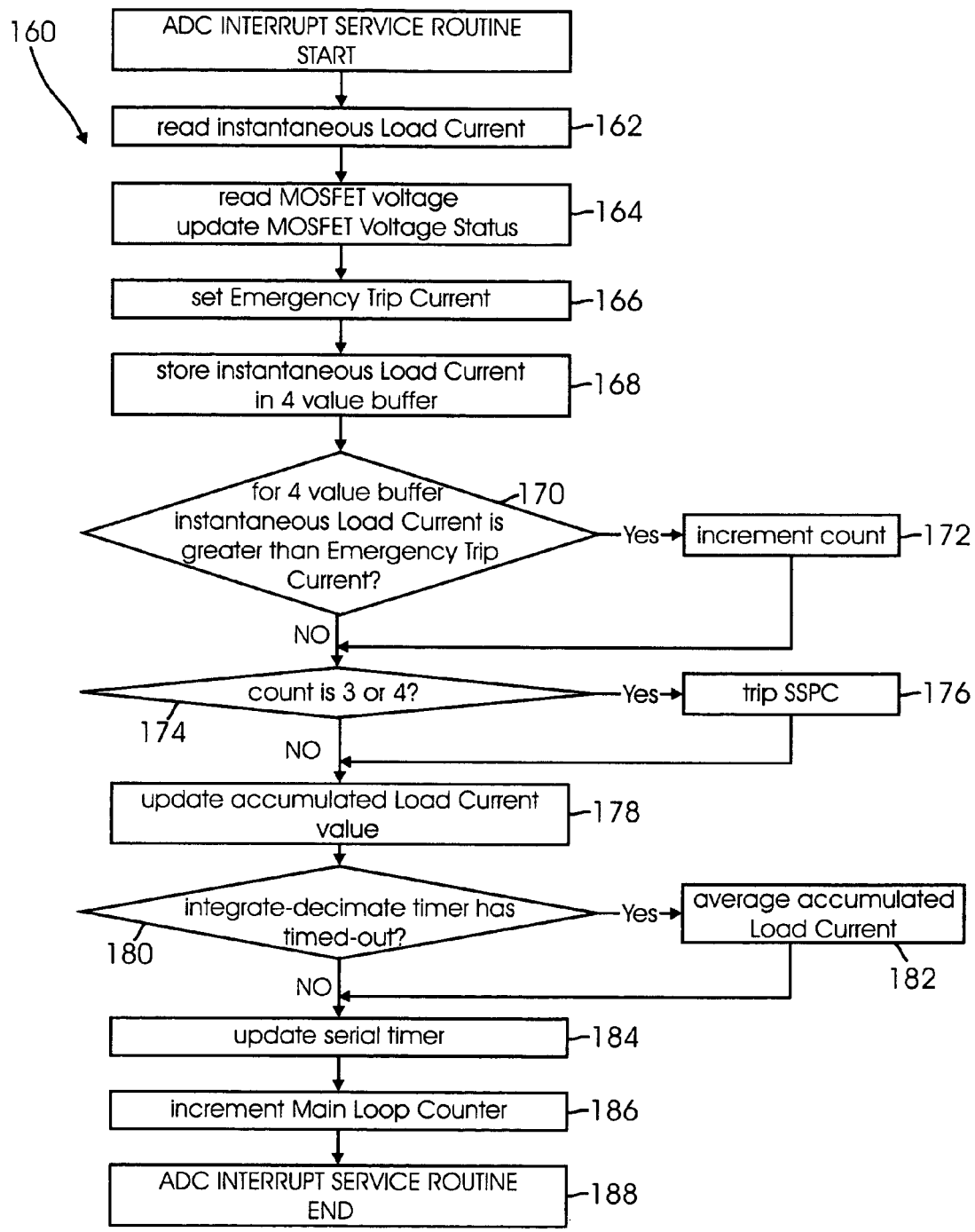
FIG. 7 is a flow chart illustrating a process in accordance with an embodiment of the present invention for periodically interrupting the operation of a microcontroller and determining whether an emergency trip fault is present.

An interrupt process in accordance with an embodiment of the present invention that can be used to obtain information from an analog-to-digital converter and to detect emergency current faults is shown in FIG. 7. The process 160 commences in response to the generation of an interrupt by the analog-to-digital converter. In response to the interrupt, the load current is read (162) and the voltage drop across the source and drain of the MOSFET is determined. In addition, the emergency trip current value is determined (166) (see discussion above) and the load current is stored in a buffer. In one embodiment, the buffer includes sufficient memory to store at least four values.

Following the storage of the load current, a determination (170) is made concerning whether the load current is greater than the emergency trip current. If the load current is greater than the emergency trip current, then a counter is incremented. If a determination (174) is made that the count is 3 or 4, then the SSPC is tripped (176). In the event that the count is less than 3, then the accumulated load current value is updated (178) and a determination (180) made concerning whether an integrate-decimate timer has timed out. If the integrate-decimate timer has timed out, then the accumulated load current is averaged (182).

If the integrate-decimate timer has not timed out or the accumulated load current has been averaged, then a serial timer that can be used in serial communications is updated (184) and the main loop counter that tracks the number of interrupt routines serviced is incremented (186).

Figure 8:
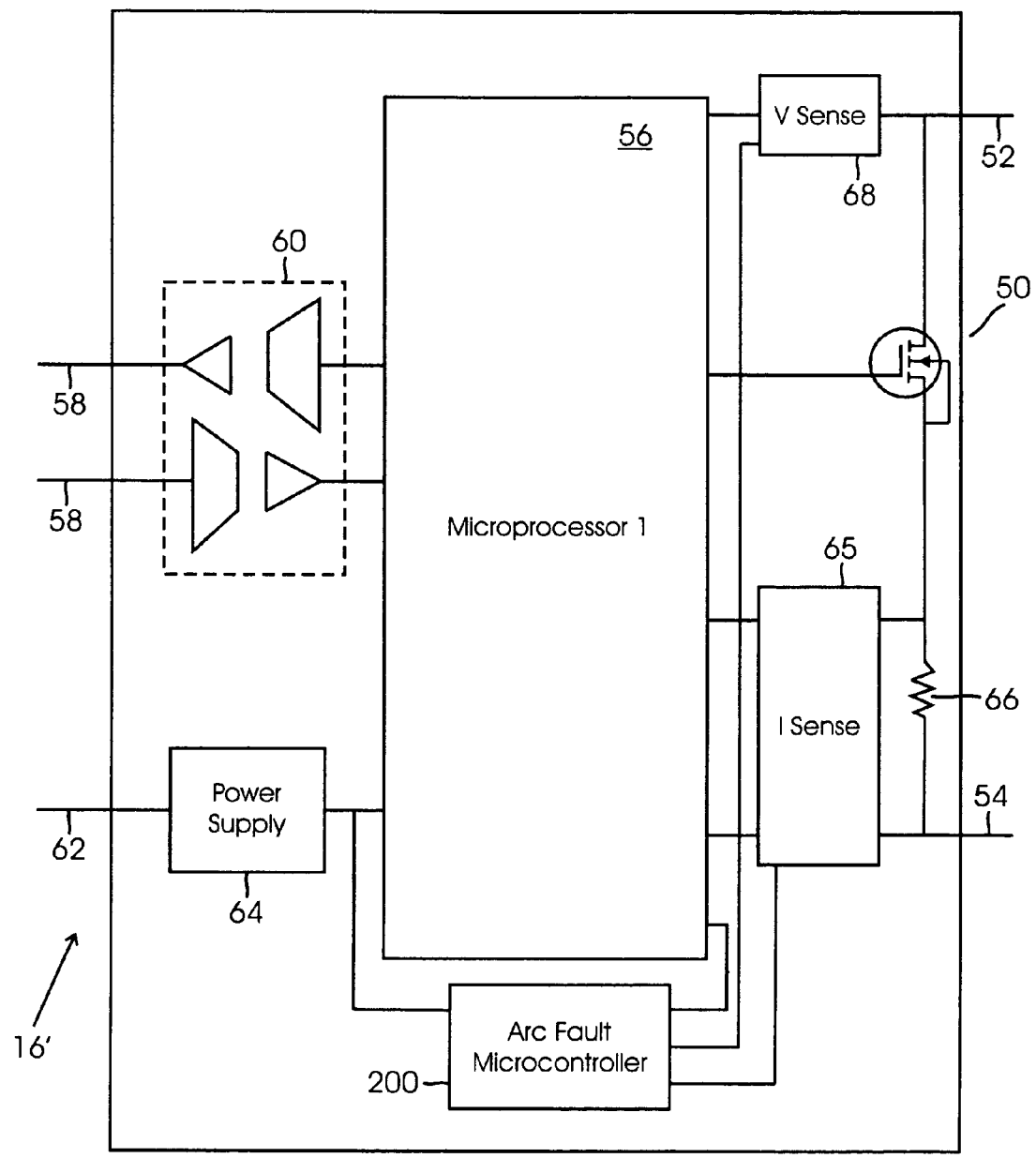
FIG. 8 is a schematic view of a solid state power controller in accordance with an embodiment of the present invention that includes arc fault detection circuitry.

A diagram illustrating an embodiment of an SSPC in accordance with the present invention including circuitry to provide arc fault protection is shown in FIG. 8. The SSPC is similar to the SSPC shown in FIG. 3 with the exception that the SSPC also includes an arc fault microcontroller 200 connected to the power supply 64, the circuitry for detecting the load voltage 68, the circuitry for detecting the load current 65 and the microcontroller 56. The arc fault microcontroller is capable of detecting arc faults in the load by monitoring the load current and voltage. Arc faults are commonly categorized into low level arc faults (such as series arcs where a loose wire periodically contacts causing current to flow through the load) and high level arc faults (such as parallel arcs). Both low level and high level arc faults can be detected by irregularities in the current waveform, particularly in the zero crossings of the current waveform. The voltage waveform can be further used to verify the presence of a fault. The arc fault microcontroller 200 can prevent an arc fault by instructing the microcontroller 56 to open the switch 50 removing power from the load when an irregularity is detected.

In other embodiments, other types of faults can be detected either with dedicated circuitry, using a single microcontroller or using multiple microcontrollers as part of an SSPC. In one embodiment, the SSPC includes circuitry for detection of ground faults. In other embodiments, the SSPC includes circuitry enabling the detection of a variety of different types of faults with increased sensitivity.

Figure 9A:
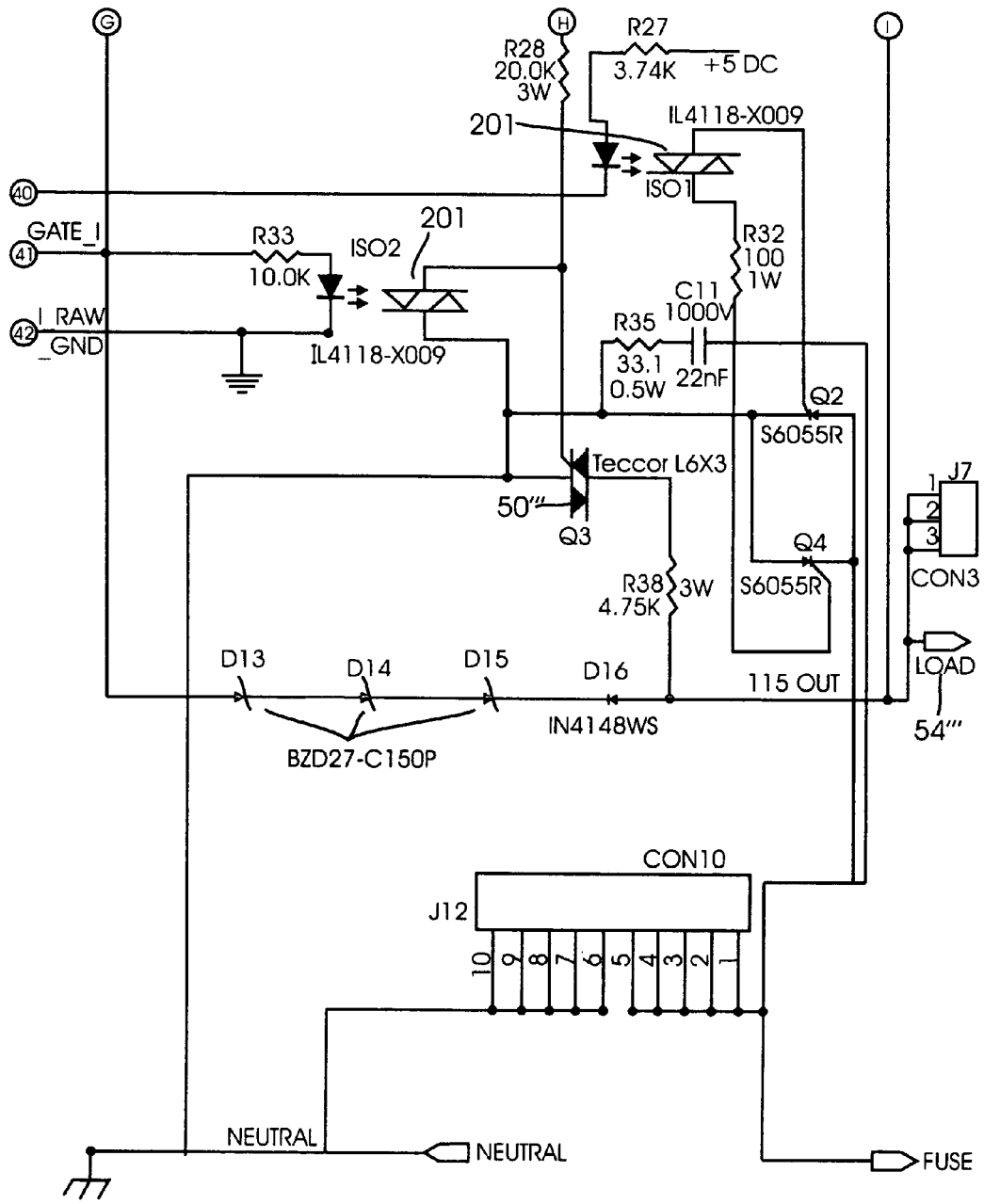
FIGS. 9A(1)-9A(10), 9B(1)-9B(4), 9C are schematic circuit diagrams of an AC solid state power controller in accordance with an embodiment of the present invention that includes arc fault protection circuitry.

Circuitry of an AC SSPC in accordance with an embodiment of the present invention including a microcontroller configured to detect arc faults and trip the SSPC in response to arc faults is illustrated in FIGS. 9A(1)-9A(10), 9B(1)-9B(4), 9C. FIGS. 9A(1)-9A(10) schematically illustrate the circuitry of the AC SSPC. The AC SSPC includes a microcontroller 56''' that is supplied with power from a power supply 64'''. The microcontroller provides an output to switch a power MOSFET 50''' that controls the supply of power from a source 52''' to a load 54'''. A pair of optical couplers 201 provide electrical isolation between the microcontroller 56''' and the power MOSFET 50''' and a magnetoresistive coupler 60''' provides electrical isolation between the microcontroller 56''' and external devices (not shown). In addition to the microcontroller 56''', a second microcontroller 200' is included that is connected to the microcontroller 56''' and a variety of other locations within the circuit. The second microcontroller 200' is configured to monitor the supplied power for indications of an arc fault. In other embodiments, the second microcontroller is replace by application specific circuitry.

The microcontroller 56''' and the circuitry used to sense the voltage and current supplied to the load by the power supply is illustrated in FIGS. 9B(1)-9B(4). The microcontroller 56''' is connected to current sensing circuitry 65''' that is configured to provide information about the supplied current. The current sensing circuitry 65''' includes a pair of operational amplifiers (Op-amps) 204 and 206. When the two inputs to the sensing circuitry 65''' are connected across a shunt resistor in the path of the supply current, the Op-amps provide information concerning the current. In the illustrated embodiment, the two comparators provide different levels of sensitivity.

The microcontroller 56''' is also connected to voltage sensing circuitry 68'''. The voltage sensing circuitry includes an input from the power supply and an input that is connected to neutral. Signals indicative of the two inputs are provided to the inputs of a comparator that provides an output signal indicative of the magnitude of the supply voltage.

Figure 9C:
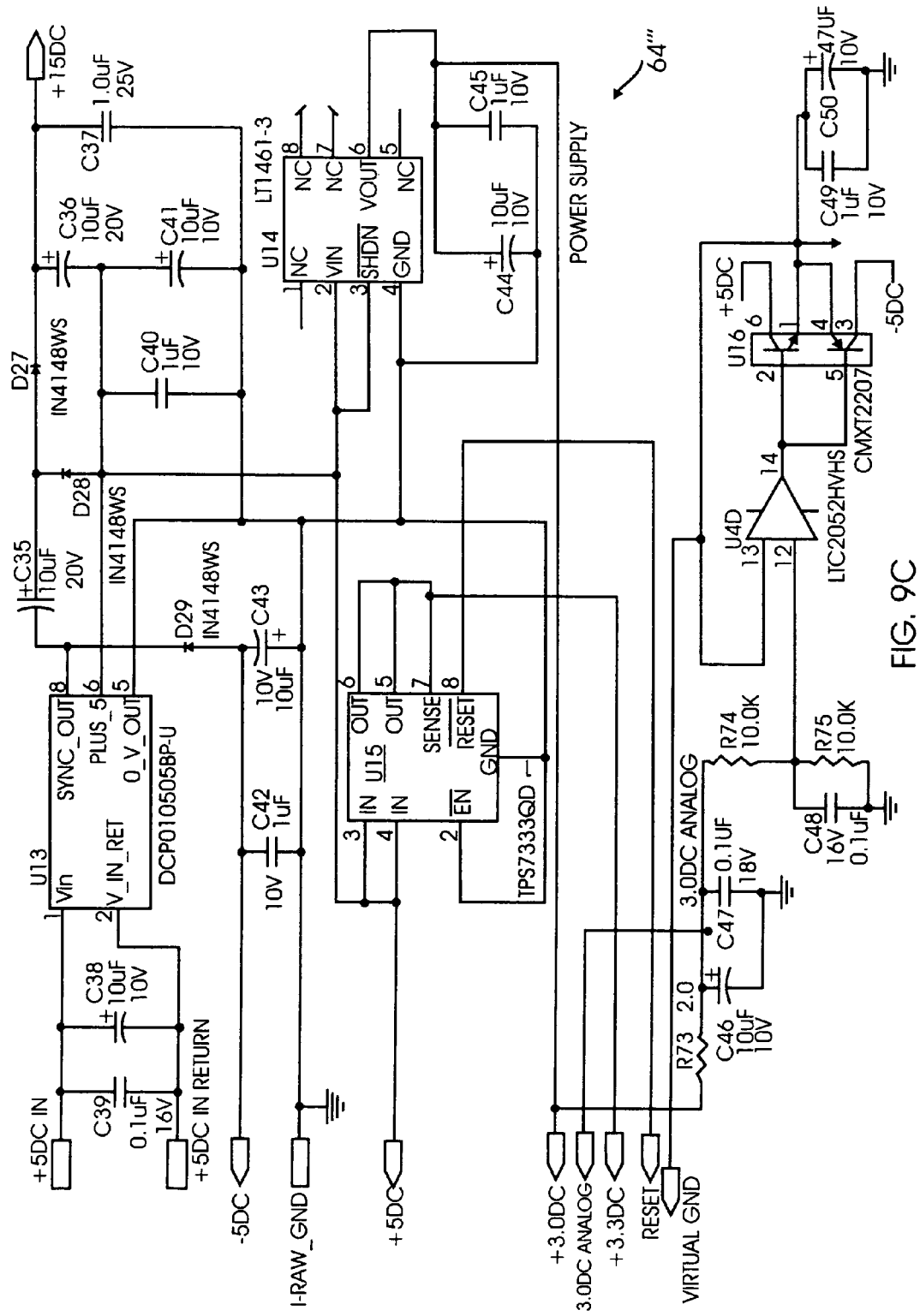

As discussed above with respect to FIGS. 9A(1)-9A(10), the AC SSPC shown in FIGS. 9A(1)-9A(10) include a power supply to provide power to various circuits within the SSPC. The circuitry of the power supply 64''' is shown in FIG. 9C.

Figure 10:
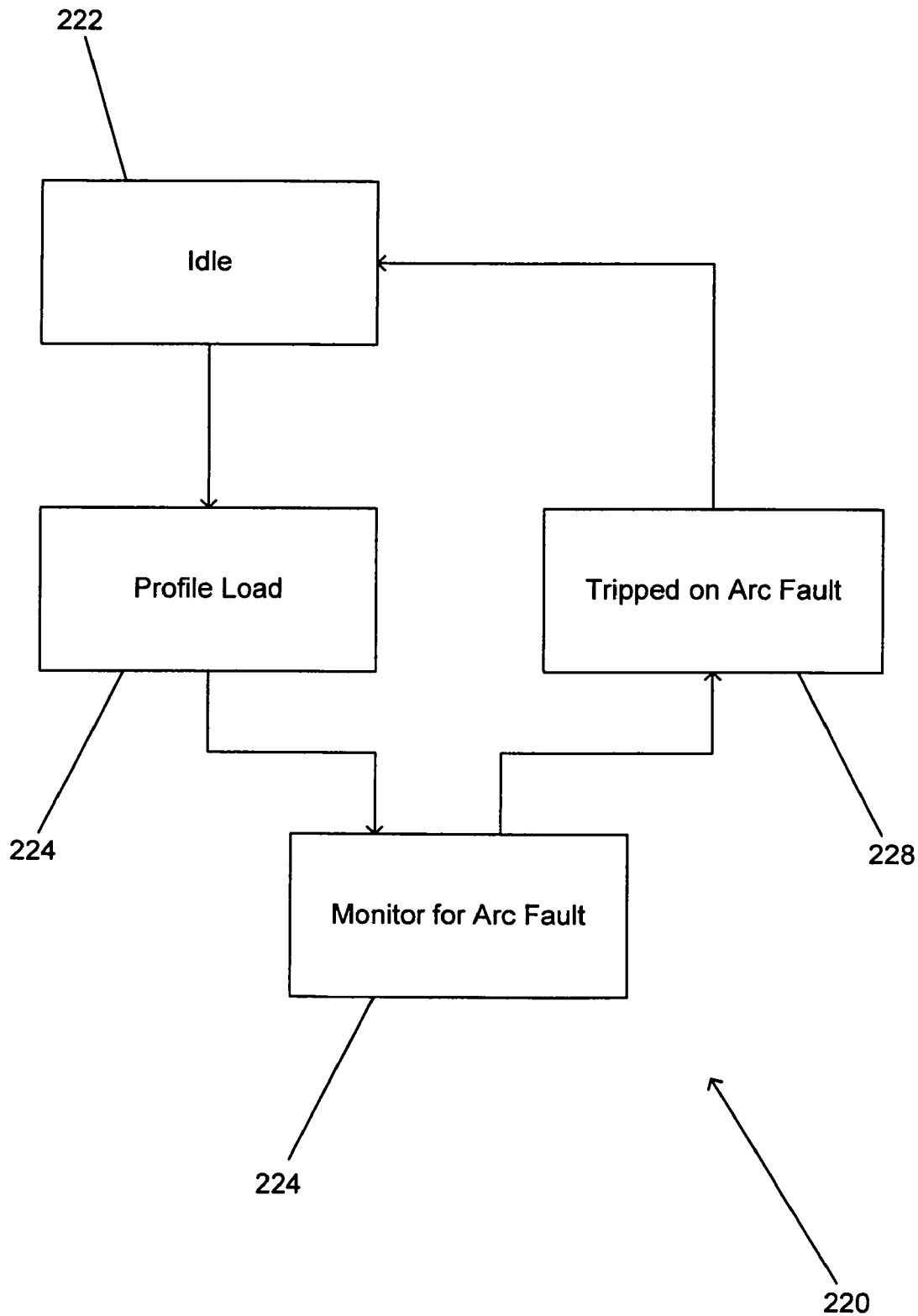
FIG. 10 is a flow diagram illustrating the operation of an arc fault protection microcontroller in accordance with an embodiment of the present invention.

The AC SSPC shown in FIGS. 9A(1)-9A(10), 9B(1)-9B(4), 9C includes a second microprocessor that is configured to detect arc faults. A process in accordance with an embodiment of the present invention for detecting arc faults is shown in FIG. 10. The process 220 involves periodic monitoring for arc faults. Therefore, the process includes idle (222) time between monitoring (224) of the load. During monitoring, the load is profiled (224). The load is profiled by measuring voltage and current within the SSPC. Once the load has been profiled (224), the profile of the load is then inspected (226) to determine whether irregularities in the profile (see discussion above) indicate the presence of arc fault. If the profile indicates that an arc fault could exist, then more samples of the load profile are collected until a final determination can be made as to whether an arc fault has occurred. If an arc fault has occurred, then the SSPC is tripped (228). Otherwise, the process returns to an idle (222) state.

Much of the above discussion relates to the operation of SSPCs in accordance with the present invention in controllably supplying power to a load and monitoring the load for faults. The fact that the operational characteristics of many embodiments of SSPCs in accordance with the present invention can be configured by external devices has also been discussed. The information presented in FIGS. 11-15 includes representations of a number of different user interfaces that enable a user to configure one or more SSPCs using an external device.

Referring back to FIG. 5, an architecture is shown that includes a microcontroller 100 that is connected to a number of SSPCs 16. The discussion of FIG. 5 refers to the fact that the microcontroller 100 can provide instructions to the SSPCs 16 and that these instructions can configured the SSPCs. In many embodiments, users require information concerning the status of on or more of the SSPCs and require the ability to change the operational characteristics of the SSPC. One way in which to provide with user information is via a user interface. As will be seen from the discussion provided below, an almost limitless variety of user interfaces are available. In many embodiments, the user interface is provided by a combination of an external device, such as the microcontroller 100 shown in FIG. 5, and the SSPCs 16. For example, the external device can receive input from the user and the SSPCs can use visual indicators such as LEDs to provide information to the user. In more sophisticated embodiments, the user interface is provided by one or more external devices, such as a microcontroller. In a number of embodiments, an external microcontroller receives input from users and provides a graphical user interface in order to convey information to users.

Figure 11:
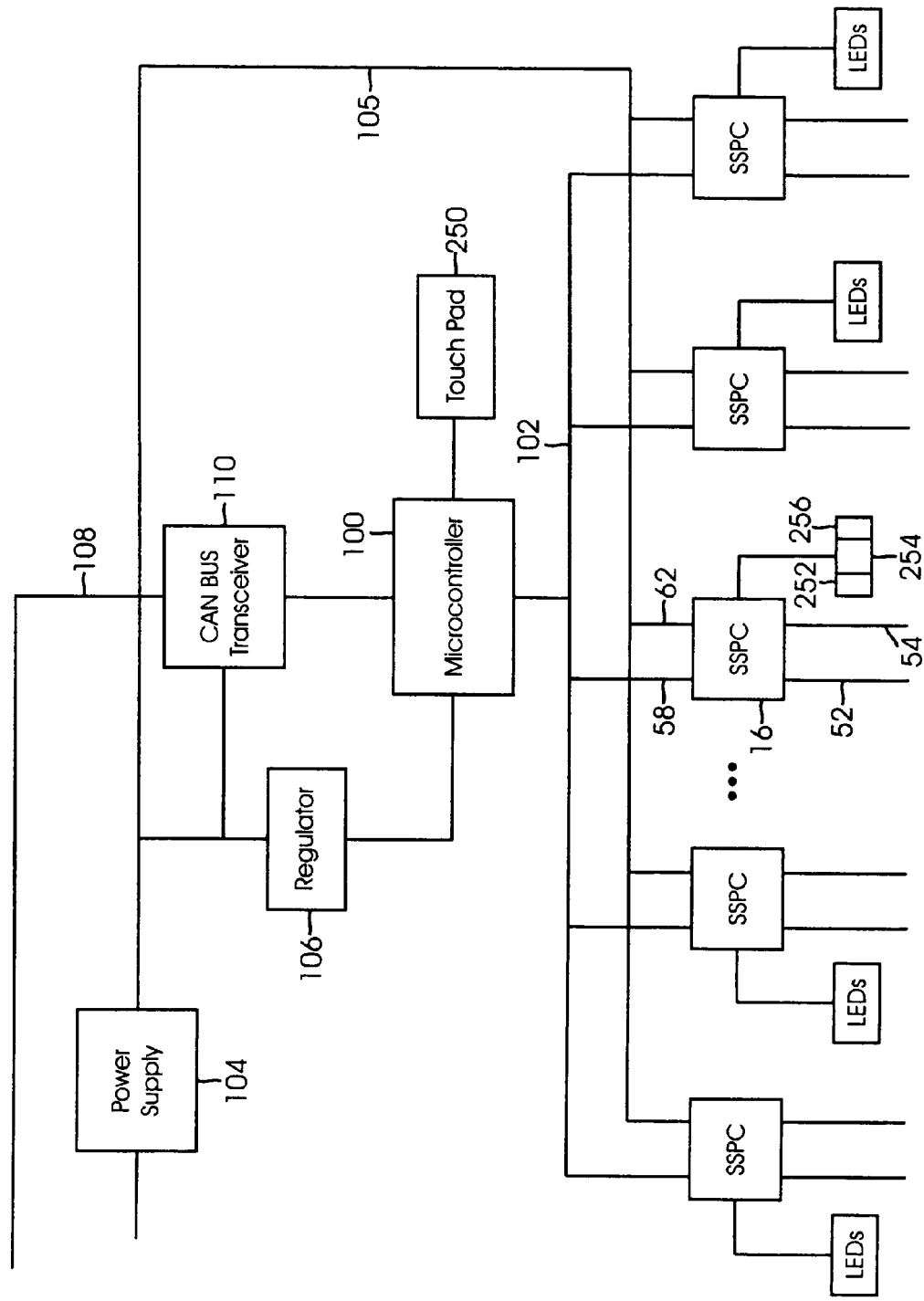
FIG. 11 is a schematic block diagram of a configuration in accordance with an embodiment of the present invention including a microcontroller, a number of solid state power controllers, a keypad and a number of LEDs.

An embodiment of an architecture that includes a keypad to receive user input and LEDs to provide output to the user is shown in FIG. 11. The architecture is similar to the architecture in FIG. 5 with the exception that the microcontroller 100 is connected to a keypad 250 and each SSPC 16 is connected to three LEDs. The three LEDs are a tripped LED 252, an idle LED 254 and a gate LED 256. The process shown in FIG. 6 includes reference in a step (140) to a tripped LED and a gate LED. As indicated previously FIG. 6 is one embodiment of a process that can be used in the operation of an SSPC and the step (140) that references the tripped LED and gate LED is an example of a suitable time in which to update the information being communicated by LEDs that may form part of a user interface. In other embodiments, a similar time may be an appropriate juncture at which to send information to an external device updating that device concerning the status of the SSPC.

In one embodiment the keypad 250 includes four buttons. The four buttons are an on button, an off button, an up button and a down button. The four buttons enable the user to toggle between SSPCs, select an SSPC and switch an SSPC on or off. In response to the user instructions, the microcontroller 100 sends instructions to one or more of the SSPCs. The SSPCs are configured to respond to the in a variety of ways including instructions applying/removing power to the load and providing outputs to the LEDs. The outputs provide visual information to the user that indicate the status of the SSPC and whether an SSPC is selected by the user.

As discussed above, an external device can provide a complete graphical user interface. In many embodiments, the graphical user interface is provided by a computing device that communicates with a microcontroller within a PDA, which controls one or more SSPCs. In other embodiments, the graphical user interface is generated by a microcontroller within a PDA.

Figure 12:
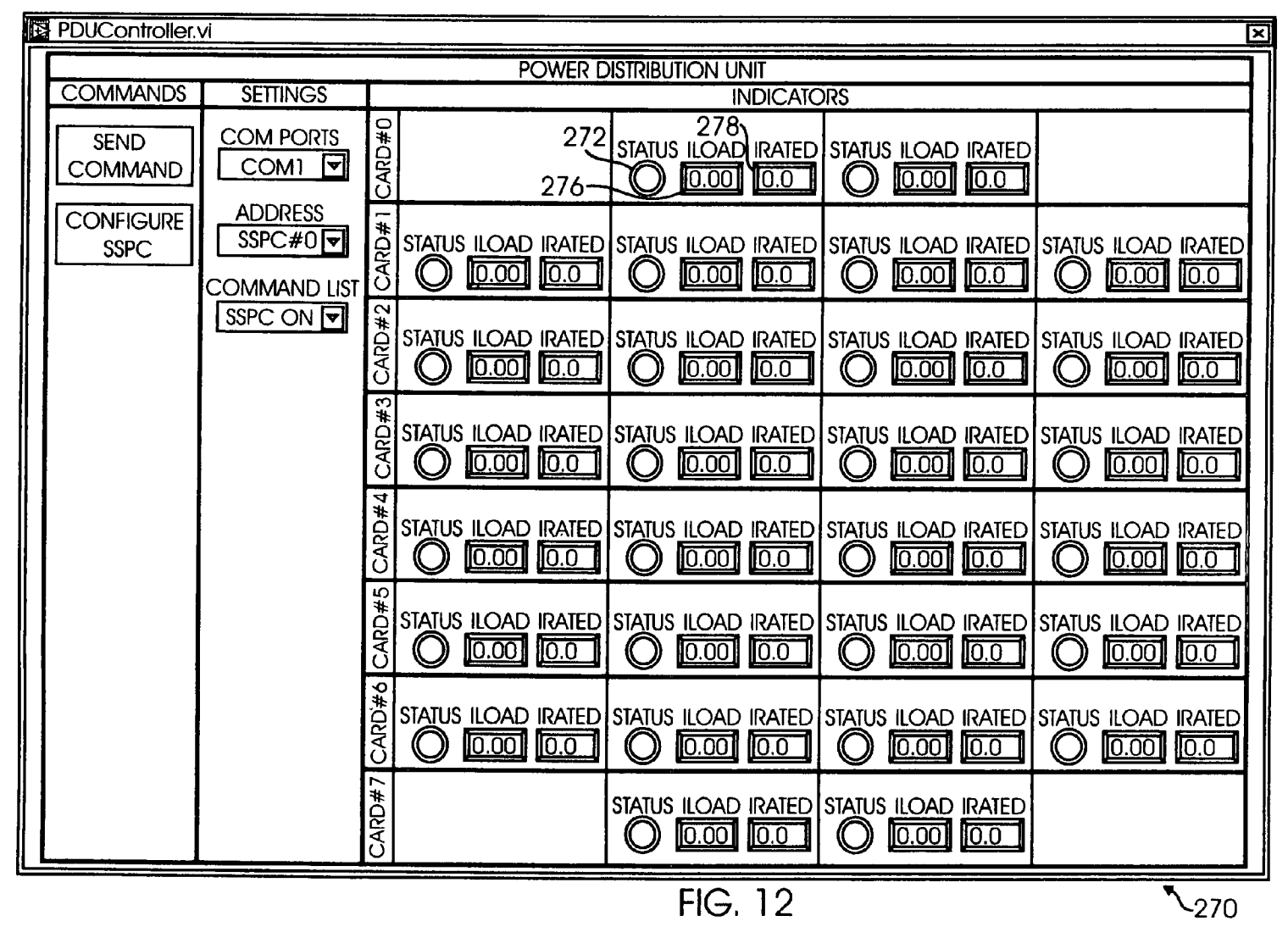

In embodiments where a graphical user interface is provided, the graphical user interface can provide the user with information concerning each of the SSPCs, their status and the operational characteristics assigned to each SSPC. A screen shot of a graphical user interface showing information concerning a number of SSPCs is provided in FIG. 12. Important features of the screen 270 of the graphical user interface are the indicator 272 that indicate whether the SSPC is active, the listing of the load current 274 and the listing of the rated current 276. The screen 270 of the graphical user interface shown in FIG. 12 provides the opportunity for a user to activate an SSPC, monitor the load current passing through the SSPC and modify the rated current of the SSPC.

Figure 13:
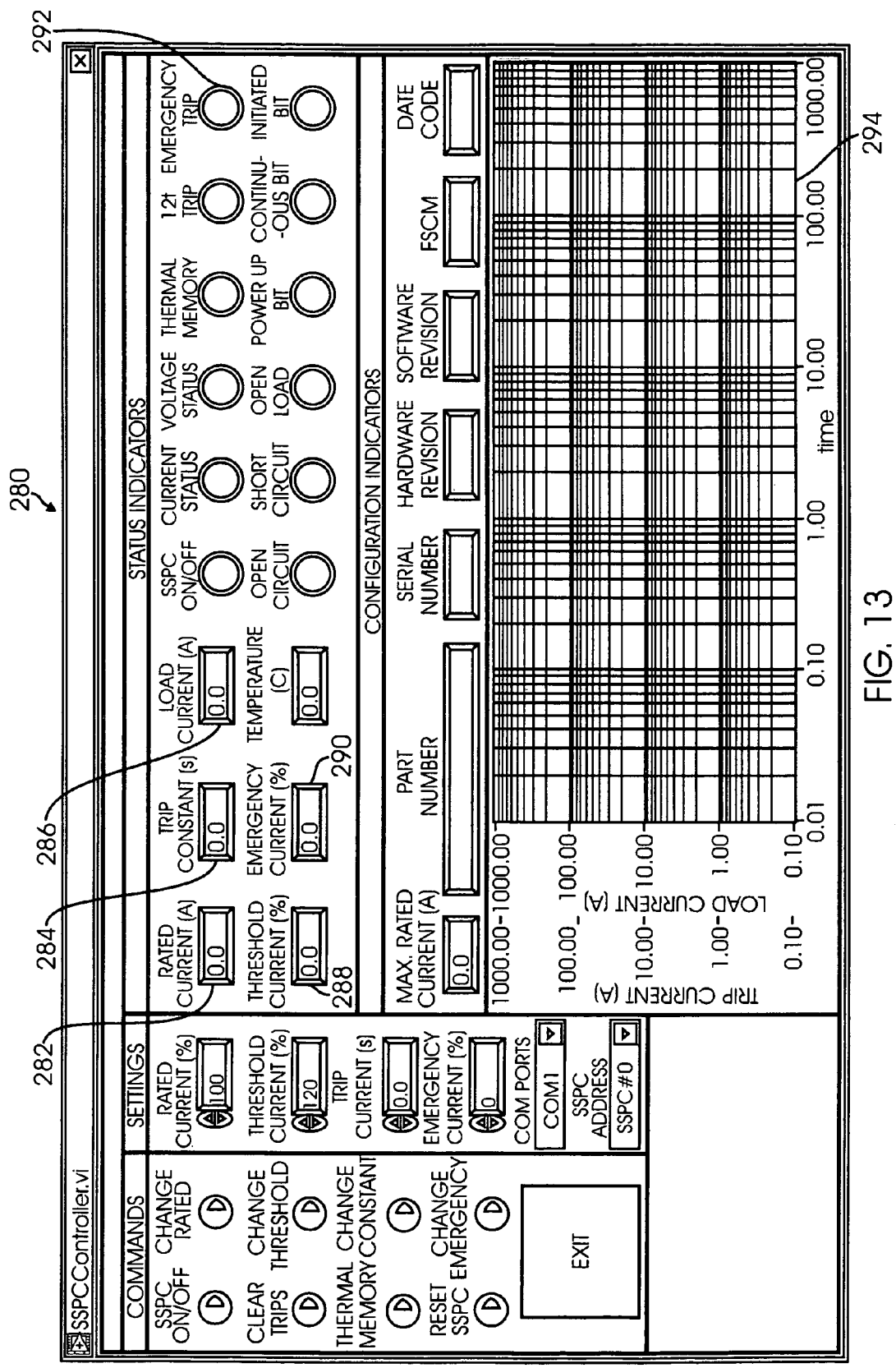
FIG. 13 is a screen shot of another display generated by a graphical user interface in accordance with an embodiment of the present invention.

In many embodiments, a graphical user interface is provided that enables the monitoring of the characteristics of the load current and/or voltage in an SSPC with respect to time. A screen shot of a graphical user interface in accordance with an embodiment of the present invention that includes information concerning the load current with respect to time is shown in FIG. 13. Important features of the screen 280 of the graphical user interface are the display of the rated current of the SSPC 282, the display of the trip constant of the SSPC 284, the display of the load current through the SSPC 286, the display of the threshold current for the SSPC 288, the display of the value of the emergency current for the SSPC 290, the array 292 of indicators that indicate the status of the SSPC and whether the SSPC has detected any of a variety of faults and a graph 294 that shows the load current and trip current of the SSPC with respect to time.

Figure 14:
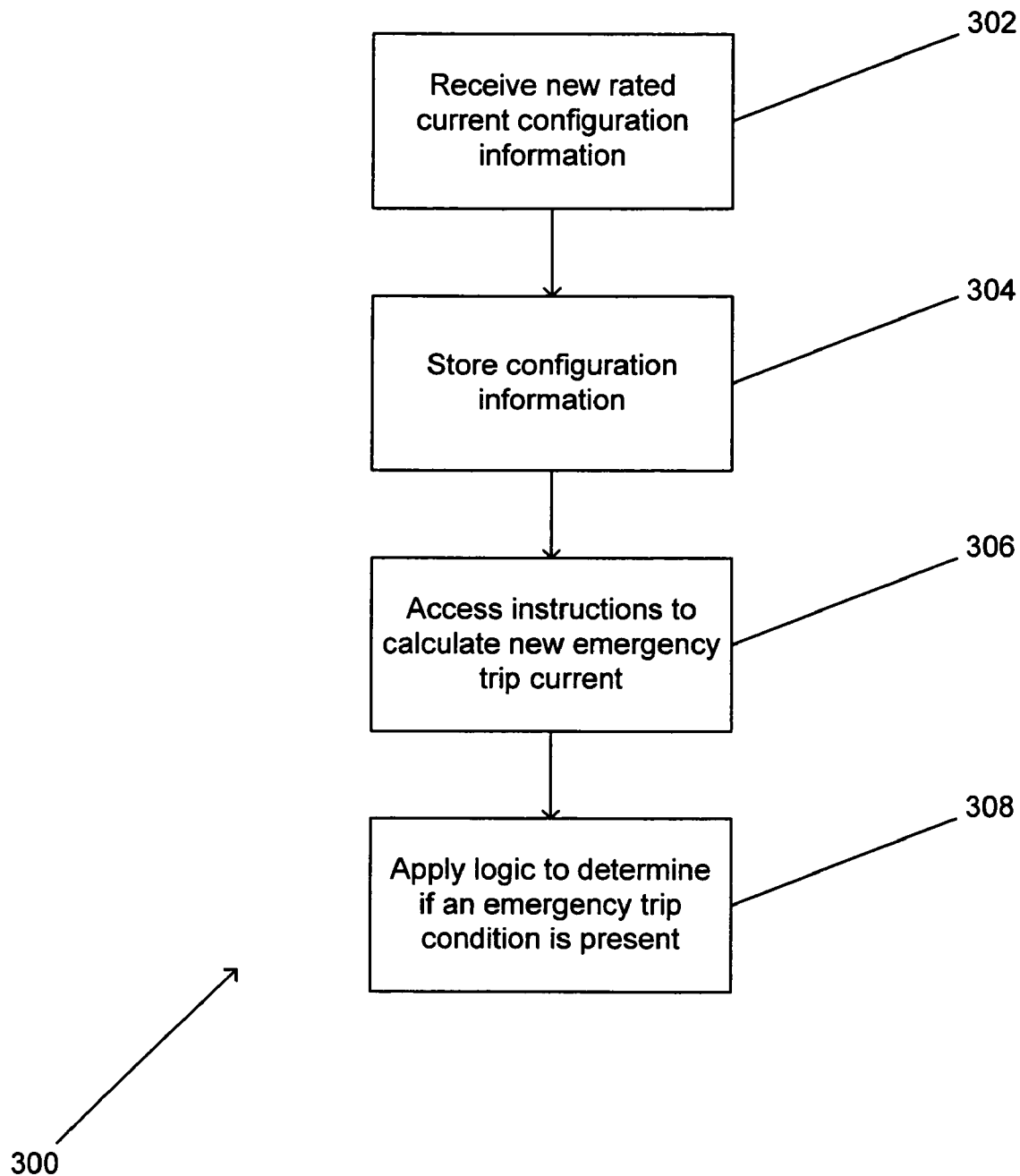
FIG. 14 is a flow chart showing a process in accordance with the present invention for modifying the operational characteristics of an SSPC in response to a user instruction.

When information is provided by a user via a graphical user interface. The device responsible for the generation of the graphical user interface processes the received information and provides instructions to the SSPC necessary to implement valid user instructions. A process that can be used by an SSPC to respond to a user instruction modifying the rated current of the SSPC in accordance with the present invention is shown in FIG. 14. The process 300 includes receiving (302) the new rated current configuration and storing (304) this information. Once the information is stored, the SSPC calculates (306) a new value for the emergency trip current and determines (308) whether an emergency trip condition is present before resuming operation. In many embodiments the SSPC can acknowledge that the modification has occurred. In other embodiments, external devices can periodical poll the SSPC to determine its status and whether its status has been successfully modified.

While the above description contains many specific embodiments of the invention, these should not be construed as limitations on the scope of the invention, but rather as an example of one embodiment thereof. Accordingly, the scope of the invention should be determined not by the embodiments illustrated, but by the appended claims and their equivalents.

What is claimed is:

1. A solid state power controller possessing a power connector, a load connector and at least one communication connector, comprising:
    a solid state switch electrically connectable between the power connector and the load connector, where the switch includes an input;
    circuitry for measuring a voltage at the power connector, the measuring circuitry configured to minimize a current drawn from the power connector by the measuring circuitry;
    a microcontroller coupled to the input of the solid state switch; and
    isolation circuitry connected to create a galvanic barrier between the microcontroller and the at least one communication connector;
    wherein the microcontroller is configured to detect an over-current condition by comparing a trip constant to a time variable calculated value which is a function of a measured load current, a rated current and a threshold current.

2. The solid state power controller of claim 1, wherein the isolation circuitry comprises one or more magnetoresistive signal isolators.

3. The solid state power controller of claim 1, wherein the solid state switch comprises a MOSFET.

4. The solid state power controller of claim 1, further comprising current sensing circuitry connected to the microcontroller and configured to sense the current flowing through the solid state switch.

5. The solid state power controller of claim 1, wherein the measuring circuitry is configured to eliminate the current drawn from the power connector by the measuring circuitry.

6. The solid state power controller of claim 1, wherein the internal microcontroller is configured to calculate the time variable value of the time variable integral expression:

$$\int_{t_0}^{t_1} [(i^2 - I_{Threshold}^2) / I_{Rated}^2] dt$$

where i is the measured load current, $I_{Threshold}$ is the threshold current and $I_{rated}$ is the rated current.

7. The solid state power controller of claim 1, wherein the internal microcontroller is configured to calculate the time variable value of the discrete time variable sum expression:

$$\sum_{\Delta t} [(i^2 - I_{Threshold}^2) / I_{Rated}^2] \Delta t$$

where i is the measured load current, $I_{Threshold}$ is the threshold current and $I_{rated}$ is the rated current.

8. The solid state power controller of claim 1, wherein the time variable value accounts for thermal memory.

9. The solid state power controller of claim 1, further comprising:
    an arc fault microcontroller coupled to the microcontroller and configured to detect an arc fault in circuitry connected to the power connector or the load connector of the SSPC;
    wherein the arc fault microcontroller is configured to respond to the sensing of an arc fault by generating a signal to open the solid state switch.

10. The solid state power controller of claim 9, wherein the arc fault microcontroller detects arc faults with different levels of sensitivity.

11. The solid state power controller of claim 1, wherein an external device is connected to at least one of the communications connectors.

12. The solid state power controller of claim 11, wherein the external device is a microcontroller.

13. The solid state power controller of claim 1, further comprising:
a time delay circuit coupled between the input of the solid state switch and the power connector;
wherein the time delay circuit is configured to change switching characteristics of the solid state switch.

14. The solid state power controller of claim 13, wherein the time delay circuit includes a resistor coupled in series with a capacitor.

15. The solid state power controller of claim 1, wherein the internal microcontroller is configured to provide a programmable emergency trip.

16. The solid state power controller of claim 15, wherein the programmable emergency trip comprises a load current threshold.

17. The solid state power controller of claim 1, wherein the microcontroller is configured to generate an input to the solid state switch in accordance with at least one predetermined operational characteristic.

18. The solid state power controller of claim 17, wherein one of the predetermined operational characteristics is a rated current.

19. The solid state power controller of claim 17, wherein one of the predetermined operational characteristics is a trip current threshold.

20. The solid state power controller of claim 17, wherein the microcontroller is programmed with instructions received from an external device after an initialization of the solid state power controller.

21. The solid state power controller of claim 20, wherein the microcontroller is further programmed with instructions stored in a memory inside the microcontroller prior to the initialization of the solid state power controller.

22. A power distribution assembly, comprising:
a plurality of solid state power controllers, each having a power connector, a load connector and at least one communication connector; and
an external microcontroller connected to each solid state power controller via the at least one communication connector;
wherein each solid state power controller includes an internal microcontroller that is connected to the at least one communication connector via isolation circuitry, where the isolation circuitry creates a galvanic barrier between the internal microcontroller and the external microcontroller;
wherein each solid state power controller is galvanically isolated from the next solid state power controller by the isolation circuitry; and
wherein the internal microcontroller is configured to detect an overcurrent condition by comparing a trip constant to a time variable calculated value which is a function of a measured load current, a rated current and a threshold current.

23. The power distribution assembly of claim 22, wherein the isolation circuitry includes a magnetoresistive signal isolator.

24. The power distribution assembly of claim 22, further comprising:
a computer connected to the external microcontroller;
wherein the computer generates a graphical user interface that conveys information concerning the operational characteristics of the solid state power controller to the user and enables the modification of the operational characteristics of a solid state power controller in response to instructions from the user.

25. The solid state power controller of claim 22, wherein the internal microcontroller is configured to calculate the time variable value of the time variable integral expression:

$$\int_{t_0}^{t_1} [(i^2 - I_{Threshold}^2)/I_{Rated}^2] dt$$

where i is the measured load current, $I_{Threshold}$ is the threshold current and $I_{rated}$ is the rated current.

26. The solid state power controller of claim 22, wherein the internal microcontroller is configured to calculate the time variable value of the discrete time variable sum expression:

$$\sum_{\Delta t} [(i^2 - I_{Threshold}^2)/I_{Rated}^2] \Delta t$$

where i is the measured load current, $I_{Threshold}$ is the threshold current and $I_{rated}$ is the rated current.

27. The solid state power controller of claim 22, wherein the time variable value accounts for thermal memory.

28. The power distribution assembly of claim 22, wherein:
each solid state power controller includes a solid state switch;
wherein the internal microcontroller in each solid state power controller is configured to control the operation of the solid state switch.

29. The power distribution assembly of claim 28, wherein:
the external microcontroller is configured to send messages to the microcontrollers in the solid state power controllers; and
the internal microcontrollers of the solid state power controllers are configured to respond to the messages sent by the external microcontrollers.

30. The power distribution assembly of claim 29, wherein at least one of the internal microcontrollers is configured to modify the manner in which the operation of the solid state switch is controlled in response to receipt of a predetermined message from the external microcontroller.

31. The power distribution assembly of claim 22, further comprising:
a keypad connected to the external microcontroller; and
at least one LED connected to each of the solid state power controllers.

32. The power distribution assembly of claim 31, wherein the keypad includes four buttons.

33. The power distribution assembly of claim 32, wherein each of the solid state power controllers is connected to three LEDs.

34. The power distribution assembly of claim 31, wherein the external microcontroller is configured to send messages to solid state power controllers in response to input received via the keypad.

35. The power distribution assembly of claim 31, wherein the internal microcontrollers of the solid state power controllers are configured to generate signals that illuminate the LEDs and convey information to a user.

* * * * *